United States Patent
Bokui et al.

(12)

(10) Patent No.: US 7,152,009 B2
(45) Date of Patent: Dec. 19, 2006

(54) PARAMETER CORRECTION CIRCUIT AND PARAMETER CORRECTION METHOD

(75) Inventors: Takahiro Bokui, Osaka (JP); Kazuhiko Nishikawa, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 188 days.

(21) Appl. No.: 10/724,189

(22) Filed: Dec. 1, 2003

(65) Prior Publication Data

US 2004/0108881 A1    Jun. 10, 2004

(30) Foreign Application Priority Data

Nov. 29, 2002    (JP)    ............................. 2002-348763

(51) Int. Cl.
*H03L 7/06*    (2006.01)
(52) U.S. Cl. .................. 702/107; 702/57; 702/64; 702/189; 327/148
(58) Field of Classification Search ............ 702/107, 702/57, 64, 65, 75, 106, 117, 124, 126, 189, 702/190; 714/746; 327/334, 147, 148, 156, 327/157

See application file for complete search history.

(56) References Cited

U.S. PATENT DOCUMENTS 5,897,608 A * 4/1999 Yokoyama et al. ......... 702/107
6,205,095 B1 * 3/2001 Hisakado et al. ......... 369/47.25
6,686,789 B1 * 2/2004 Lopata et al. ............... 327/334
6,826,504 B1 * 11/2004 Rueger et al. .............. 702/107

FOREIGN PATENT DOCUMENTS

| JP | JP 3-150613 | 6/1991 |
|---|---|---|
| JP | 04-137902 | 5/1992 |
| JP | 07-055588 | 3/1995 |

OTHER PUBLICATIONS

Translation of JP 07-055588.*
Translation of JP 04-137902.*

* cited by examiner

*Primary Examiner*—Hal Wachsman
(74) *Attorney, Agent, or Firm*—McDermott Will & Emery LLP

(57) ABSTRACT

In a parameter correction circuit in an LSI, a reference resistor element with high precision having a resistance value set to a target value is connected to an external terminal of the LSI. A constant current from a mirror circuit connected to a current supply flows through the reference resistor element. A voltage value generated in the reference resistor element is measured by a voltage measuring circuit. The constant current also flows through a variable resistor element. The resistance value of the variable resistor element is adjusted so that a voltage generated in the variable resistor element corresponds to the voltage generated by the reference resistor element.

21 Claims, 10 Drawing Sheets fzero1=0.5kHz
fc1=1kHz=fzero2
fpole1=2kHz=fc2

PARAMETER CORRECTION CIRCUIT AND PARAMETER CORRECTION METHOD

BACKGROUND OF THE INVENTION

The present invention relates to a parameter correction circuit and a parameter correction method which correct production deviations in parameters of a device such as a resistor element, and are desirably applied to a PLL (Phase Locked Loop) circuit to be included in a semiconductor integrated circuit for use in, for example, a data writing/reading system of a recording-type optical disk.

Conventionally, in a recording-type optical disk, for example, a DVD-R and a DVD-RAM, address signals, referred to as wobble signals, are physically located in its tracks. A PLL circuit, which is included in a semiconductor integrated circuit for use in a data writing/reading system of such a recording-type optical disk, multiplies the wobble signal 186 times to generate a recording clock so that based upon this recording clock, data is written on an recording-type optical disk in an unrecorded state.

Here, as shown in FIG. 10, such a PLL circuit is provided with a phase comparator 50, a charge pump circuit 51, a filter circuit 52, a voltage control oscillator 53 and a frequency divider 54. With respect to writing process onto the recording-type optical disk, in the case where a plurality of speed modes of the writing process, such as onefold, twofold, fourfold and eightfold speed modes, are prepared, the loop band of the PLL circuit needs to be changed in accordance with this set speed mode. In order to change the loop band, in general, in an open loop characteristic diagram shown in FIG. 11, the loop band needs to be changed, with ratios of a gain cross-point fc, a pole point fpole and a zero point fzero being maintained at constant values. For example, upon changing the speed from the onefold mode to the twofold mode, the above-mentioned gain cross-point fc, the pole point fpole and the zero point fzero need to be respectively doubled.

More specifically, factors that are used for changing the loop band while maintaining the above-mentioned ratios at constant values include the resistance value of a resistor 52r included in the above-mentioned filter circuit 52, a charge pump current outputted from the charge pump circuit 51, a gain of the voltage control oscillator 53 and a frequency-dividing ratio of the frequency divider 54, and these factors need to be changed.

With respect to the method for changing the loop band by changing the resistance value of the resistor 52r included in the filter circuit 52, in an attempt to include the resistor 52r inside a semiconductor integrated circuit, since the resistance value of the resistor 52r generated inside the semiconductor integrated circuit also deviates in response to deviations in manufacturing processes of the semiconductor integrated circuit, it becomes difficult to include the resistor 52r therein. For this reason, the resistor 52r is included in the filter circuit 52 as an externally added part, as shown in FIG. 10.

However, in the case where the resistor 52r is included as such an externally added part, a plurality of resistors 52r need to be included depending on writing speed modes, and since the number of terminals to be prepared in a semiconductor integrated circuit is limited, it is difficult to include resistors 52r, the number of which is the same as the number of the speed modes to be set, as externally added parts. Moreover, since various recording-type optical disks, such as DVD-Rs and DVD-RAMs, have different loop bands to be used, the number of the resistors 52r required is represented by the number of speed modes multiplied by the kinds of recording-type optical disks to be applied; thus, in an attempt to use a PLL circuit compatibly in these various recording-type optical disks, it becomes difficult to include the required number of resistors 52r as externally added parts by using the limited number of terminals prepared in the semiconductor integrated circuit.

For this reason, for example, JP-A No. 03-150613 has disclosed a technique in which, a parameter correction circuit for correcting influences from production deviations in a resistor is included in a semiconductor integrated circuit, and a variable resistor is included in the semiconductor integrated circuit so that the resistance value of this variable resistor is changed.

SUMMARY OF THE INVENTION

The resistance value of the variable resistor that is included in the semiconductor integrated circuit is changed by using the above-mentioned technique in response to the writing speed mode, and upon changing and adjusting the resistance value, the above-mentioned parameter correction circuit may be used to adjust the resistance value to a desired value. In this method, it is not necessary to externally include a plurality of resistors in the semiconductor integrated circuit with respect to one kind of a recording-type optical disk.

As shown in FIG. 12, the present inventors propose a parameter correction circuit of this type, and following description will discuss this parameter correction circuit.

FIG. 12 is a circuit diagram that shows a structure of a parameter correction circuit prepared based upon the above-mentioned idea. In this case, an explanation is given of a case in which the parameter is a resistor element.

In FIG. 12, reference numeral 1 represents a current supply, 2 represents a mirror circuit that is constituted by two transistors and connected to the current supply 1, Rv represents a variable resistor element capable of switching resistance value R1 in a range from 0Ω to Rv Ω, 7 represents a voltage measuring circuit and 8 represents a CPU.

The constant current supply 1 is connected to the mirror circuit 2, and the mirror circuit 2 allows a current I1 that is equal to the current of the constant current supply 1 to flow through the variable resistor element Rv. One of the terminals of the variable resistor element Rv is connected to the above-mentioned mirror circuit 2, with the other end connected to ground (GND). The voltage measuring circuit 7 is connected to the above-mentioned mirror circuit 2 so that, when a current is allowed to flow through the variable resistor element Rv from the mirror circuit 2, a voltage generated in the variable resistor element Rv is measured, and the measured voltage is A/D converted and outputted. The CPU 8 receives the A/D converted voltage from the voltage measuring circuit 7, and adjusts and sets the resistance value of the variable resistor element Rv based upon the voltage generated in the variable resistor element Rv.

More specifically, the following description will discuss correcting operations that a conventional parameter correcting circuit carries out on the resistance value of the variable resistor element Rv. First, supposing that the resistance value of the variable resistor element Rv is set not to a target value R, but to a certain value R1 that is offset due to production deviations. This certain value R1 is of course not known preliminarily. First, a predetermined current value I1 is given to the variable resistor element Rv from the constant current supply 1 by the mirror circuit 2. At this time, a potential difference V1=R1*I1 generated in the variable resistor element Rv is measured by the voltage measuring circuit 7 so that the resulting potential difference V1 is outputted to the CPU 8. The CPU 8 calculates the ratio of sizes between the potential difference V(=R*I1) that is generated in the variable resistor element Rv when the current I1 of the constant current supply 1 is allowed to flow through the variable resistor element Rv in the case of the resistance value of the variable resistor element Rv being set to the target value R and the potential difference V1 actually generated in the above-mentioned variable resistor element Rv, and based upon the result of calculations V/V1, adjusts the resistance value of the variable resistor element Rv. For example, when the resistance value of the variable resistor element Rv has a value twice as much as the target value R due to production deviations, V1=R1*I1=2R*I1 holds, and consequently, V/V1=0.5; therefore, in the case where the variable resistor element Rv is constituted by a plurality of unit resistors that are series-connected, the variable resistor element Rv is adjusted and set to a value that is one-half the initial resistance value.

Next, under normal conditions after the completion of the resistance value correction, the constant current supply 1 is turned off to prevent the current from flowing through the variable resistor element Rv; thus, the value of the variable resistor element Rv in which the resistance value has been corrected is outputted as a resistance output and utilized. Here, it is supposed that the upper limit value Rv of the resistance value of the variable resistor element Rv is preliminarily set to satisfy Rv>R, R1.

However, in the arrangement of the parameter correction circuit proposed in FIG. 12, in the case where the constant current supply 1 outputs a current value different from the current value I1 due to production deviations and the like, since the CPU 8 carries out calculations on the assumption that the constant current supply 1 output a predetermined current value I1, it is not possible to adjust the resistance value of the variable resistor element Rv to a target value with high precision.

For example, in the case where the actual current value of the constant current supply 1 is reduced to a value smaller than the expected value I1 by 10%, that is, 0.9*I1, due to production deviations, the voltage value V1', measured by the voltage measuring circuit 7, is reduced to V1'=0.9*I1*R1 so that V/V1'=1.1*V/V1 holds; thus, the resistance value after the adjustment of the variable resistor element Rv forms a resistance value greater than the target value R by 10%, and is not adjusted to the target value R with high precision.

The present invention relates to a parameter correction circuit and a parameter correction method, and its objective is to correct a parameter of a resistor element and the like with high precision, without being influenced by production deviations, with respect to parts to be included in a constant current supply and the like.

In order to achieve the above-mentioned objective, in the present invention, in a parameter correction circuit included in a semiconductor integrated circuit, a reference parameter, which has a preliminarily known parameter value, is connected to the semiconductor integrated circuit, and a current is allowed to flow through this reference parameter from a mirror circuit, so that the current value of the mirror circuit is found, and based upon the resulting value, a variable parameter that is a correction target is corrected and made less susceptible to production deviations of the mirror circuit and the like.

That is, according to the present invention, the parameter correction circuit, which is a built-in parameter correction circuit of a semiconductor integrated circuit, comprises a current supply circuit, a variable parameter, a plurality of switching circuits, a voltage measuring circuit and an adjusting circuit that adjusts a parameter value of the variable parameter, wherein the current supply circuit, the variable parameter, the plurality of switching circuits, the voltage measuring circuit and the adjusting circuit are included in the semiconductor circuit, any one of the switching circuits is connected to a reference parameter, the reference parameter having a preliminarily known parameter value, the switching circuits are allowed to switch electrical connections among the current supply circuit, the reference parameter, the variable parameter and the voltage measuring circuit, the voltage measuring circuit measures voltages generated in the reference parameter and the variable parameter respectively when currents are respectively supplied to the reference parameter and the variable parameter from the current supply circuit, and the adjusting circuit adjusts the parameter value of the variable parameter based upon the voltages of the reference parameter and the variable parameter measured by the voltage measuring circuit.

According to the present invention, in the parameter correction circuit, the variable parameter and the reference parameter are a variable resistor element and a reference resistor element.

According to the present invention, in the parameter correction circuit, the variable parameter and the reference parameter are a variable inductor element and a reference inductor element.

According to the present invention, in the parameter correction circuit, the variable parameter and the reference parameter are a variable capacitor element and a reference capacitor element.

According to the present invention, in the parameter correction circuit, the reference parameter is placed outside the semiconductor integrated circuit, and connected to an external terminal of the semiconductor integrated circuit.

According to the present invention, in the parameter correction circuit, the reference parameter is shared by the parameter having a preliminarily known parameter value, which is originally connected to the external terminal of the semiconductor integrated circuit.

According to the present invention, in the parameter correction circuit, the reference parameter is included in the semiconductor integrated circuit.

According to the present invention, in the parameter correction circuit, the semiconductor integrated circuit having the built-in parameter correction circuit is a PLL circuit, the PLL circuit having a phase comparator, a charge pump, a filter circuit, a voltage control oscillator and a frequency divider, the filter circuit being constituted by a resistor element and a capacitor element, the variable parameter being included in the semiconductor integrated circuit as the resistor element or the capacitor element.

According to the present invention, in the parameter correction circuit, the current supply circuit comprises a current supply, and a mirror circuit having an output terminal, the mirror circuit being connected to the current supply and allows a current corresponding to the current of the current supply to flow from the output terminal.

According to the present invention, in the parameter correction circuit, the switching circuits comprise first and second switching circuits, the first switching circuit is placed between the mirror circuit and the reference parameter, and the second switching circuit is placed between the mirror circuit and the variable parameter.

According to the present invention, in the parameter correction circuit, the switching circuits further comprise a third switching circuit, and the third switching circuit is connected to the output terminal of the mirror circuit so that the voltage measuring circuit measures a voltage of the third switching circuit when a current is allowed to flow from the mirror circuit to the third switching circuit.

According to the present invention, in the parameter correction circuit, the current supply circuit comprises a current supply and a mirror circuit having first and second terminals, the mirror circuit being connected to the current supply and allows a current having the same value as the current of the current supply to flow from the first output terminal to the reference parameter, and also to flow from the second output terminal to the variable parameter.

According to the present invention, in the parameter correction circuit, the switching circuits comprise first and second switching circuits, the first switching circuit is placed between the reference parameter and the voltage measuring circuit, and the second switching circuit is placed between the variable parameter and the voltage measuring circuit.

According to the present invention, in the parameter correction circuit, the current supply circuit comprises a load circuit, the load circuit has a transistor that has a source connected to the current supply or grounded and supplies a current through a drain thereof, and a switching circuit that is connected to the gate of the transistor so as to on-off control the transistor.

According to the present invention, in the parameter correction circuit, the voltage measuring circuit comprises a sample hold circuit that holds the voltage of the reference parameter, and a comparator that compares the voltage of the variable parameter with the voltage of the reference parameter that has been held in the sample hold circuit.

According to the present invention, the parameter correction circuit is used as a current-voltage converter which, after the resistance value of the variable resistor element has been corrected to a target value, outputs a voltage that is generated in the variable resistor element, upon allowing a current to flow from the current supply or another current supply to the variable resistor element.

According to the present invention, in the parameter correction circuit, the semiconductor integrated circuit comprises another variable parameter having the same structure as the variable parameter, and the another variable parameter is capable of being adjusted to the same parameter-value as the variable parameter that is included in the parameter correction circuit.

According to the present invention, the parameter correction circuit is used as an oscillator circuit in which, after the inductance value of the variable inductor element has been corrected to a target value, an oscillating frequency thereof is set to a target frequency.

According to the present invention, in the parameter correction circuit, the variable parameter is constituted by a plurality of unit parameters that are series-connected to one another, and among all the unit parameters, a desired number of series circuits of the continuous unit parameters are extracted.

According to the present invention, in the parameter correction circuit, the variable parameter is constituted by a plurality of unit parameters that are parallel-connected to one another, and among all the unit parameters, a desired number of parallel circuits of the continuous unit parameters are extracted.

According to the present invention, a parameter correction method, which corrects a parameter value of a variable parameter by using a computer, wherein the computer carries out the steps of: connecting a current supply circuit to a reference parameter having a preliminarily known parameter value; allowing a current to flow from the current supply circuit through the reference parameter to measure a voltage of the reference parameter at this time; calculating a value of the current supplied from the current supply circuit based upon the voltage of the reference parameter and the parameter value of the reference parameter; calculating a target voltage of the variable parameter when the parameter value of the variable parameter is set to the target value based upon the value of the current calculated; while allowing a current to flow from the current supply circuit to the variable parameter and measuring a voltage of the variable parameter at this time, correcting the parameter value of the variable parameter so that the voltage of the variable parameter is set to the target voltage.

As described above, in the present invention, a current is allowed to flow from the mirror circuit connected to the current supply to a reference parameter having a preliminarily known parameter value so that a voltage of the reference parameter at this time is detected, and based upon this voltage, the current value of the current supply is calculated; therefore, even when the current value deviates due to production deviations of the current supply, it is possible to correct the parameter value of the variable parameter in response to a current value of each of the current supplies.

In particular, in the present invention, even when, upon measuring a voltage of the reference parameter and the variable parameter, the parameter values of the first and second switching circuits give influences on the corresponding voltage value, a current is allowed to flow from the mirror circuit to the third switching circuit in a separated manner so that a voltage of the third switching circuit at this time is measured; therefore, each of the voltages generated in the reference parameter and the variable parameter is reduced by a voltage generated in the above-mentioned third switching circuit so that the influences from the first and second switching circuits can be removed; thus, it becomes possible to carry out the correction on the variable parameter with higher precision.

Moreover, in the present invention, the reference parameter is connected to the first output terminal of the mirror circuit without using the switching circuit, and the variable parameter is also connected to the second output terminal of the mirror circuit without using the switching circuit; therefore, upon measuring a voltage appearing each of these parameters and calculating the parameter value thereof, it becomes possible to carry out a parameter correcting process with high precision, without taking the parameter value of the switching circuit into account.

Furthermore, in the present invention, a reference parameter is first series-connected to a load circuit, and at this time, a voltage of the reference parameter is measured, and a variable parameter is then series-connected to the load circuit; thus, the parameter value of the variable parameter is adjusted so that a voltage of the variable parameter at this time becomes equal to the voltage that appeared in the above-mentioned reference parameter. Therefore, by properly selecting and setting the reference parameter to a value that is equal to the target value of the variable parameter, it becomes possible to correct the parameter value of the variable parameter to the target value without being influenced by production deviations in the load circuit.

DETAILED DESCRIPTION OF THE INVENTION

Referring to the figures, the following description will discuss preferred embodiments of the present invention.

Embodiment 1

Figure 1:
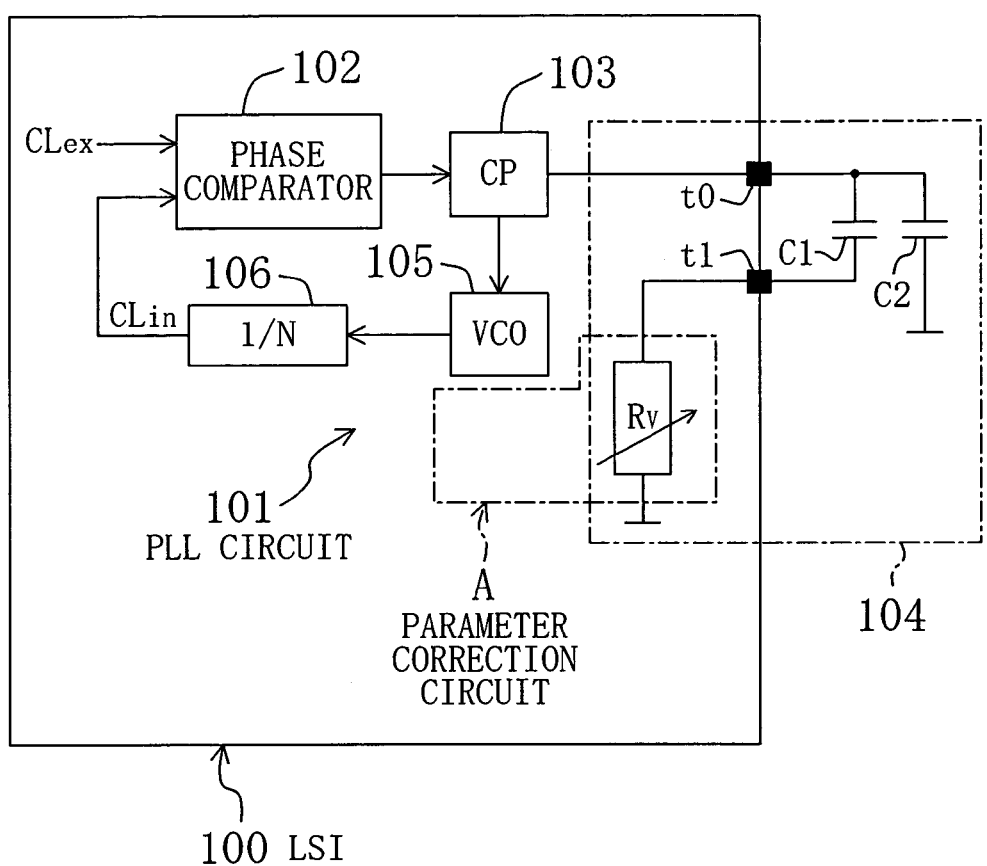
FIG. 1 shows a schematic entire structure of a semiconductor integrated circuit that includes a parameter correction circuit of a first embodiment of the present invention.

FIG. 1 shows a schematic structure of a semiconductor integrated circuit that includes a parameter correction circuit in accordance with a first embodiment of the present invention.

In FIG. 1, reference numeral 100 represents a semiconductor integrated circuit (LSI) used for a data writing/reading system and the like for use in, for example, a recording-type optical disk, and 101 represents a PLL circuit. This PLL circuit 101 is provided with a phase comparator 102, a charge pump circuit 103, a filter circuit 104, a voltage control oscillator 105 and a frequency divider 106. The filter circuit 104 is provided with a variable resistor element Rv and two capacitor elements C1 and C2. The PLL circuit 101 is included inside the above-mentioned semiconductor integrated circuit 100, except the two capacitor elements C1 and C2 of the filter circuit 104. In the filter circuit 104, the two capacitor elements C1 and C2, placed outside the semiconductor integrated circuit 100, are connected to the variable resistor Rv included inside the semiconductor integrated circuit 100 through an external terminal t1 of the semiconductor integrated circuit 100, and also connected to the charge pump 103 included inside the semiconductor integrated circuit 100 through an external terminal t0.

In the above-mentioned PLL circuit 101, the phase comparator 102 compares phases of an external reference clock CLex and an internal clock CLin from the frequency divider 106, and based upon the phase difference thereof, sends an UP signal or a DOWN signal to the charge pump 103. In response to the UP signal or DOWN signal from the phase comparator 102, the charge pump 103 carries out charging and discharging processes on the filter circuit 104. The filter circuit 104 integrates each of the charging and discharging operations from the charge pump circuit 103 to convert it into a dc voltage that forms an input voltage to the voltage control oscillator 105. This input voltage allows the output frequency of the voltage control oscillator 105 to change so that the frequency divider 106 divides the output frequency from the voltage control oscillator 105. By repeating a sequence of these operations, the phase of the external reference clock CLex and the phase of the internal clock CLin are finally made in synchronism with each other.

With respect to the variable resistor Rv to be included in the filter circuit 104 of the PLL circuit 101, in the case where, for example, the recording-type optical disk is a DVD-R, a DVD-RW or the like, since a plurality of data-writing speed modes, such as twofold, fourfold and eightfold speed modes, are prepared, it is included so as to change the loop band of the PLL circuit 101 in response to the selected speed mode, and placed inside the semiconductor integrated circuit 100. Here, in the case where the PLL circuit 101 is compatibly used for a DVD-R, a DVD-RW and a RAM, the combinations of the two capacitor elements C1 and C2 may be arranged in a separate manner so that three types of capacitor element combinations may be prepared.

Further, a parameter correction circuit A is included inside the above-mentioned semiconductor integrated circuit 100. This parameter correction circuit A includes the above-mentioned variable resistor Rv as a variable parameter. The following description will discuss a specific example of the structure of the parameter correction circuit A.

Figure 2A:
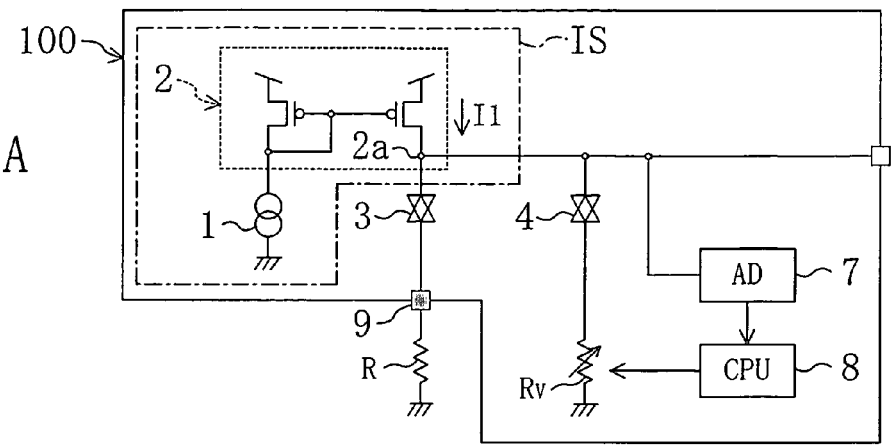
FIG. 2A shows the structure of the parameter correction circuit of the first embodiment of the present invention.

FIG. 2A shows the structure of the parameter correction circuit A. The following description will exemplify a case in which the variable resistor element Rv is used as the parameter as described above.

In FIG. 2A, IS represents a current supplying circuit that is constituted by a current supply 1 and a mirror circuit 2 constituted by a transistor which, in response to a current from the current supply 1, allows a current I1 that corresponds to the current value of the current to flow. Reference numerals 3 and 4 represent independent switching circuits, R represents a reference resistor element (reference parameter) placed outside the LSI 100, Rv represents a variable resistor element (variable parameter) which is capable of switching the resistance value thereof in a range from 0Ω to the maximum Rv Ω, and corresponds to the variable resistor element Rv explained in FIG. 1. Moreover, reference numeral 7 represents a voltage-measuring circuit and 8 represents a CPU (computer).

In the parameter correction circuit of the present embodiment, the constant current supply 1 is connected to the mirror circuit 2, one end of the reference resistor element (reference parameter) R is connected to the output terminal 2a of the mirror circuit 2 through the first switching circuit 3 and an external terminal 9 of the LSI 100, and the other end of the reference resistor element R is connected to ground (GND); thus, the current having a current value I1 that is equal to the current from the constant current supply 1 is supplied to the reference resistor element R. In the same manner, one end of the variable resistor element (variable parameter) Rv is connected to the output terminal 2a of the mirror circuit 2 through the second switching circuit 4, and the other end of this variable resistor element Rv is connected to GND.

Moreover, a voltage measuring circuit 7 is connected to the output terminal 2a of the mirror circuit 2, and this voltage measuring circuit 7 measures a voltage of each of the reference resistor element R and the variable resistor element Rv, and A/D converts this voltage, and outputs the resulting voltage to the CPU (computer) 8. The CPU 8 (adjusting circuit) carries out predetermined calculations based upon the voltage and the like measured by the above-mentioned voltage measuring circuit 7, and adjusts and sets the resistance value of the variable resistor element Rv in a manner so as to correspond to the result of the calculations.

Next, with respect to the parameter correction circuit in accordance with the present embodiment, the following description will discuss the operations thereof First, the correcting operations of the resistance value of the variable resistor element Rv are explained. The first switching circuit 3 is turned on, while the second switching circuit 4 is turned off. In this state, the current value I1 of the constant current supply 1 is given to the reference resistor element R through the first switching circuit 3 by the mirror circuit 2. At this time, a potential difference $Vr=Rr*I1$ of the reference resistor element R having a resistance value Rr is measured by the voltage measuring circuit 7, and this voltage value Vr is outputted to the CPU 8, and stored therein. Since the resistance value Rr of the reference resistor element R has been preliminarily known, the current value I1 of the constant current supply 1 is found as $I1=Vr/Rr$. Based upon the current value I1, it is found that, in order to set the variable resistor element Rv to a resistance value corresponding to the target value R, the measuring voltage $R*I1$ in the voltage measuring circuit 7 can be adjusted so that $R*I1=R*Vr/Rr$.

Next, the first switching circuit 3 is turned off, and the second switching circuit 4 is turned on. In this case, the same current value I1 of the constant current supply 1 is given to the variable resistor element Rv through the second switching circuit 4 by the mirror circuit 2. Here, suppose that the resistance value of the variable resistor element Rv is set not to a target value R, but to a certain value R1, due to production deviations. This resistance value R1 is of course not preliminarily known. At this time, the potential difference V1 of the variable resistor element Rv is represented by $V1=R1*I1$, and measured by the voltage measuring circuit 7; thus, the resistance value of the variable resistor element Rv is adjusted so that the voltage value V1 is set to the voltage value $R*Vr/Rr$ that has been preliminarily calculated.

With respect to normal operations, the constant current supply 1 is turned off, the first switching circuit 3 is turned off, and the second switching circuit 4 is turned on. The variable resistor element Rv is maintained at the setting obtained after the variable resistor element Rv has been adjusted so that the resistance value can be outputted as a resistance output, and utilized.

Here, in comparison with the variable resistor element Rv that is included in an LSI 100, the reference resistor element R to be included outside the LSI 100 is allowed to have a resistance value with higher precision. For this reason, in the case where a reference resistor element having a resistance value with an error of 1% in high precision is selected as the reference resistor element Rv, since the current value I1' that is allowed to flow by the constant current supply 1 is calculated as $I1'=Vr/(Rr*0.99)=1.01*I1$, it becomes possible to correct the resistance value of the variable resistor element Rv to a resistance value having an error within 1% with respect to the target value R.

As described above, in accordance with the present embodiment, the reference resistor element R is included outside the LSI, and the current value I1 of a current flowing through the reference resistor element R is found with high precision so that it becomes possible to provide a parameter correction circuit that is less susceptible to production deviations in the constant current supply 1.

Here, it is supposed that the upper limit value (indicated by the same sign Rv) of the resistance value of the variable resistor element Rv is preliminarily designed so as to satisfy Rv>R, R1 and that the resistance value of each of the first and second switching circuits 3 and 4 is set to such a small value that influences thereof are ignorable.

Moreover, in the present embodiment, the explanation has been given of a case in which the reference resistor element R and the variable resistor element Rv are placed on the GND side; however, another arrangement in which the mirror circuit 2 is included on the GND side with the reference resistor element R and the variable resistor element Rv being included on the power supply side or another arrangement in which the mirror circuit 2 and the reference resistor element R as well as the variable resistor element Rv are placed on opposite sides respectively with respect to the reference voltage, may of course be adopted. Moreover, with respect to the internal structure of the mirror circuit 2, another structure other than the structure described above may be used.

Furthermore, the reference resistor element R is connected to the external terminal 9 of the LSI 100, and placed outside the LSI 100; however, in the case where, in the arrangement having the reference resistor element R included inside the LSI 100, the range of production deviations in the reference resistor element R is narrow, the reference resistor element R may be included inside the LSI 100. This is not limited to the case of the reference resistor element R, and is also applied to the case in which a capacitor element and an inductor element are adopted as reference parameters.

Embodiment 2

Referring to the figures, the following description will discuss a second embodiment of the present invention.

Figure 2B:
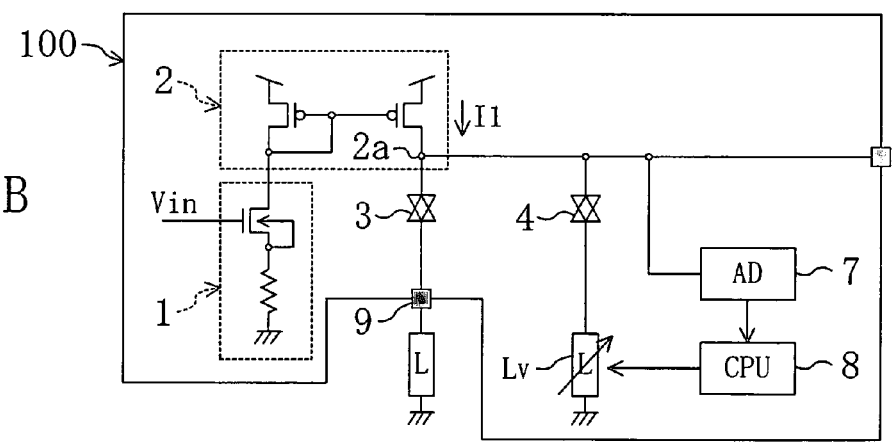
FIG. 2B shows the structure of a parameter correction circuit of a second embodiment of the present invention.

FIG. 2B shows a structure of a parameter correction circuit in accordance with the second embodiment of the present invention. In this embodiment, an inductor element is used as the parameter.

In FIG. 2B, reference numeral 1 represents a variable current supply that is formed by a source follower constituted a resistor and a transistor, 2 represents a mirror circuit constituted by two p-type transistors that allow a current I1 that is equal to a current from the variable current supply 1 to flow, 3 and 4 represent respectively independent switching circuits, L represents a reference inductor element that is included outside the LSI 100, Lv represents a variable inductor element in which the inductance value can be switched in a range of 0 H to Lv H, 7 represents a voltage measuring circuit and 8 is a CPU.

In the parameter correction circuit in the present embodiment, the variable current supply 1 is connected to the mirror circuit 2, a current I1 from the mirror circuit 2 is supplied to the variable inductor element Lv through the switching circuit 4, and the other end of the variable inductor element Lv is connected to GND. Moreover, the current I1 from the mirror circuit 2 is also supplied to the reference inductor element L through the switching circuit 3 and the external terminal 9 of the LSI 100, with the other end of the reference inductor element L being connected to GND. Moreover, the current I1 from the mirror circuit 2 is also supplied to the voltage measuring circuit 7. The output of the voltage measuring circuit 7 is given to the CPU 8 so that based upon the result of the operations in the CPU 8, the inductance value of the variable inductor element Lv is changed.

With respect to the parameter correction circuit of the present embodiment having the above-mentioned arrangement, the following description will discuss the operations thereof First, correcting operations of the inductance value of the variable inductor element Lv will be explained.

First, a switching circuit 4 is turned off, and a switching circuit 3 is turned on. When a voltage Vin that is directly proportional to time is externally applied thereto, a variable current supply 1 supplies a current I1=I*t that is directly proportional to time. This current I1 is applied to a reference inductor element L through the switching circuit 3 by the mirror circuit 2. At this time, a potential difference Vr=Lr*ΔI1/Δt=Lr*I, generated by the reference inductor element L, is measured by a voltage measuring circuit 7. The value of the above-mentioned potential difference Vr is transmitted to a CPU 8 and stored therein.

Next, in the case where the switching circuit 3 is turned off with the switching circuit 4 being turned on, at this time, the same current value I1 of the variable current supply 1 is given to a variable inductor element Lv through the switching circuit 4 by the mirror circuit 2. Here, suppose that the variable inductor element Lv has its inductance value set not to a target value Lo, but to a certain value L1 due to production deviations. Since this inductance value L1 is generated by production deviations, it is not preliminarily known. In this case, the potential difference V1=L1*ΔI1/Δt=L1*I, generated by the variable inductor element Lv, is measured by the voltage measuring circuit 7, and the variable inductor element Lv is adjusted so that the resulting voltage value is set to the result of the calculations, Lr*I, obtained beforehand.

During normal operations, the variable current supply 1 is turned off, the switching circuit 4 is turned on, and the switching circuit 3 is turned off. Moreover, the variable inductor element Lv is maintained at the setting obtained after the variable inductor element Lv has been adjusted so that the inductance value is outputted as an inductor element Lv that has been adjusted to the target value, and utilized.

Here, in comparison with the variable inductor element Lv that is included in an LSI100, the reference inductor element L to be included outside the LSI100 is allowed to have an inductance value with higher precision. For this reason, when an inductor element of 1% is selected as the reference inductor element L, it becomes possible to correct the inductance value of the variable inductor element Lv with a minimum of 1% in precision.

As described above, in accordance with the present embodiment, the reference inductor element L is included outside the LSI100, and the current value to be charged to the reference inductor element L is found with high precision so that it becomes possible to provide a parameter correction circuit that is less susceptible to production deviations in the variable current supply 1.

Here, it is supposed that the upper limit value (indicated by the same sign Lv) of the inductance value of the variable inductor element Lv is preliminarily designed so as to satisfy Lv>L, L1 and that the resistance components of the reference inductor element L and the variable inductor element Lv are set to such small values that influences thereof are ignorable.

Moreover, in the present embodiment, the explanation has been given of a case in which the mirror circuit 2 is included on the power supply side with the reference inductor element L and the variable inductor element Lv being placed on the GND side; however, another arrangement in which the mirror circuit 2 is included on the GND side with the reference inductor element L and variable inductor element Lv being placed on the power supply side or another arrangement in which the mirror circuit 2 and the reference inductor element L as well as the variable inductor element Lv are placed on opposite sides respectively with respect to the reference voltage, may of course be adopted. Moreover, with respect to the internal structures of the variable current supply 1 and the mirror circuit 2, structures other than the structures described above may be used.

Embodiment 3

Referring to the figures, the following description will discuss a third embodiment of the present invention.

Figure 2C:
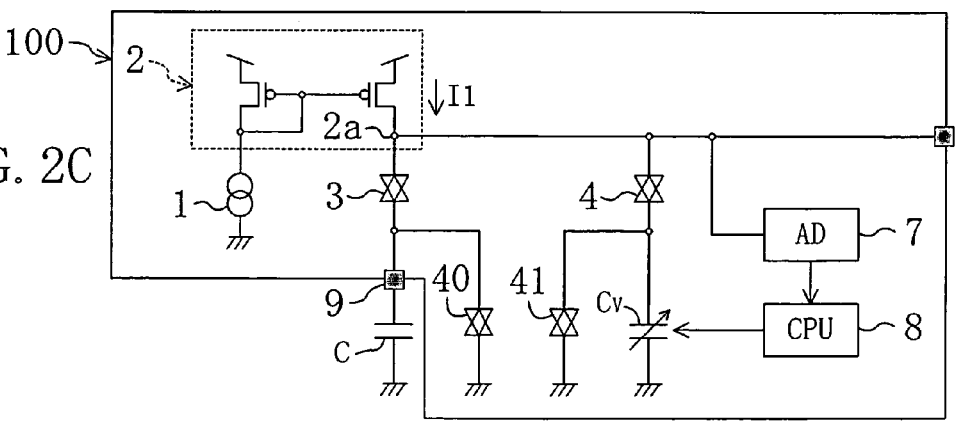
FIG. 2C shows the structure of a parameter correction circuit of a third embodiment of the present invention.

FIG. 2C shows a structure of a parameter correction circuit in accordance with the third embodiment of the present invention. In this embodiment, a capacitor element is used as the parameter.

In FIG. 2C, reference numeral 1 represents a current supply, 2 represents a mirror circuit that is constituted by two p-type transistors that allow a current I1 that is equal to a current from the current supply 1 to flow, 3 and 4 represent respectively independent switching circuits, C represents a reference capacitor that is included outside the LSI 100, and Cv represents a variable capacitor in which the capacitance value can be switched in a range from initial 0 F to the maximum Cv F. Here, the maximum value of the capacitance value Cv is indicated by the same sign Cv. Reference numeral 7 represents a voltage measuring circuit, 8 is a CPU, and 40 and 41 are respectively independent switching circuits.

In the parameter correction circuit of the present embodiment, the constant current supply 1 is connected to the mirror circuit 2 so that the current I1 is supplied to the variable capacitor Cv from the mirror circuit 2 through the switching circuit 4, and the other end of the variable capacitor Cv is connected to GND.

Moreover, the current I1 from the mirror circuit 2 is also supplied to the reference capacitor C through the switching circuit 3 and the external terminal 9 of the LSI 100, with the other end of the reference capacitor C being connected to GND). Furthermore, the current I1 from the mirror circuit 2 is also supplied to the voltage measuring circuit 7, and the voltage measuring circuit 7 is further connected to the CPU 8 so that based upon the result of the operations in the CPU 8, the capacitance value of the variable capacitor Cv is adjusted and set by the CPU 8. Here, terminals of the reference capacitor C and the variable capacitor Cv on the side opposite to the side on which these are connected to GND, are connected to GND through the switching circuit 40 and the switching circuit 41.

With respect to the parameter correction circuit of the present embodiment having the above-mentioned arrangement, the following description will discuss the operations thereof. First, correcting operations of the capacitance of the variable capacitor Cv will be explained.

First, while both of the switching circuit 4 and the switching circuit 3 are turned off, the switching circuit 40 and the switching circuit 41 are respectively turned on, so as to initialize the respective charges in the reference capacitor C and the variable capacitor Cv; and, after a sufficient period of time for initialization has been elapsed, these are turned off.

Next, a switching circuit 4 is turned off. After a switching circuit 3 has been turned on for a fixed time T, this is turned off so that the current value I1 of the constant current supply 1 is given to the reference capacitor C from the mirror circuit 2 through the switching circuit 3. At this time, a potential difference Vr=I1*T/Cr generated by the reference capacitor C is measured by the voltage measuring circuit 7. The value of the above-mentioned potential difference Vr is transmitted to a CPU 8 and stored therein. Since the value of the reference capacitor Cr has been preliminarily known, the current value I1 of the constant current supply 1 is found as I1=Vr*Cr/T. Based upon this value, it is found that, in order to set the variable capacitor Cv to a target value Co, the measuring voltage in the voltage measuring circuit 7 can be adjusted so that I1*T/Co=Vr*Cr/Co.

Successively, with the switching circuit 3 being set to OFF, the switching circuit 4 is turned on for only the fixed time T in the same manner as described above, and then turned off; thus, in this case, the same current value I1 of the constant current supply 1 is given to the variable capacitor Cv by the mirror circuit 2 through the switching circuit 4. Here, suppose that the capacitance value of the variable capacitor Cv is set not to a target value Co, but to a certain value C1, due to production deviations. Here, since the certain value C1 is generated by production deviations, it is not preliminarily known. At this time, the potential difference V1=I1*T/C1 generated by the variable capacitor Cv is measured by the voltage measuring circuit 7; thus, the variable capacitor Cv is adjusted by the CPU 8 so that this voltage value is set to the result of the calculations, Vr*Cr/Co, that have been preliminarily found.

With respect to normal operations, the constant current supply 1 is turned off, the switching circuit 4 is turned on, the switching circuit 3 is turned off, and the switching circuits 40 and 41 are turned off. The variable capacitor Cv is maintained at the setting obtained after the adjustments so that the capacitance value can be outputted as a capacitance value Cv that has been adjusted to the target value Co, and then utilized.

Here, in comparison with the variable capacitor Cv that is included in an LSI 100, the reference capacitor C to be included outside the LSI 100 is allowed to have a capacitance value with higher precision. For this reason, in the case where a capacitor having an error within 1% in precision is selected as the reference capacitor C, since the equation, I1=Vr*Cr*1.01/T=1.01*I1, holds, it becomes possible to adjust and correct the capacitance value of the variable capacitor Cv to a capacitance value having an error within 1%.

As described above, in accordance with the present embodiment, the reference capacitor C is included outside the LSI 100, and a current value to be charged to the reference capacitor C is found with high precision so that it becomes possible to provide a parameter correction circuit that is less susceptible to production deviations in the constant current supply 1.

Here, it is supposed that the upper limit value (indicated by the same sign Cv) of the capacitance value of the variable capacitor Cv is preliminarily designed so as to satisfy Cv>C, C1 and that the parasitic capacitance value of each of the switching circuits 3, 4, 10 and 11 is set to such a small value that influences thereof are ignorable.

Moreover, in the present embodiment, the explanation has been given of a case in which the mirror circuit 2 is placed on the power supply side with the reference capacitor C and the variable capacitor Cv being placed on the GND side; however, another arrangement in which the mirror circuit 2 is included on the GND side with the reference capacitor C and the variable capacitor Cv being included on the power supply side or another arrangement in which the mirror circuit 2 and the reference capacitor C as well as the variable capacitor Cv are placed on opposite sides respectively with respect to the reference voltage, may of course be adopted. Moreover, with respect to the internal structure of the mirror circuit 2, another structure other than the structure described above may be used. In addition, with respect to the initialization of the reference capacitor C and the variable capacitor Cv, these capacitors are set to GND voltage by using the two switches 40 and 41; however, another arrangement in which these are initialized to another reference voltage value may be used with the same effects.

Embodiment 4

Referring to the figures, the following description will discuss a fourth embodiment of the present invention.

Figure 3:
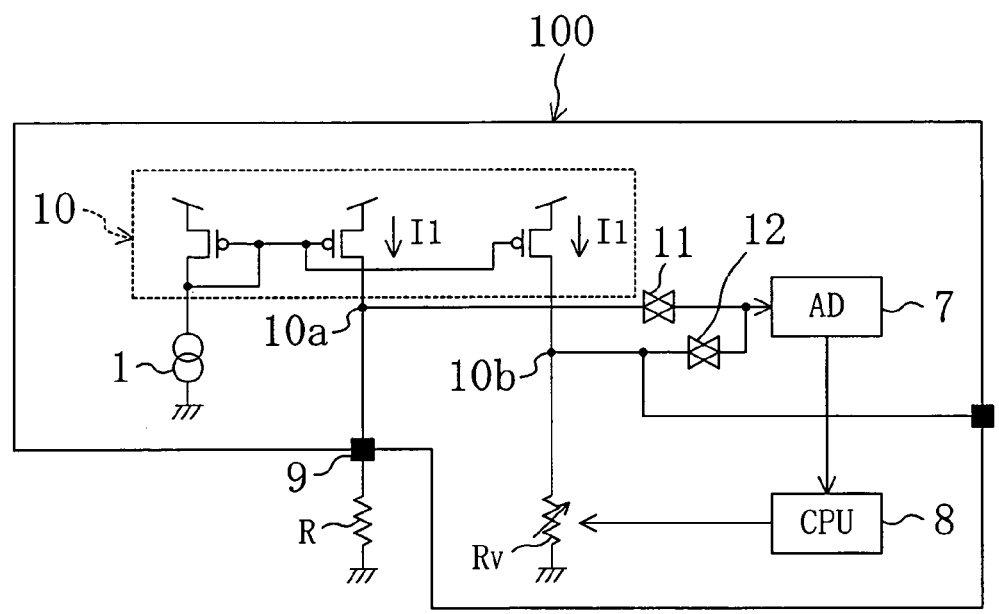
FIG. 3 is shows the structure of the parameter correction circuit of the fourth embodiment of the present invention.

FIG. 3 shows a structure of a parameter correction circuit in accordance with the present embodiment. This embodiment also exemplifies a case in which a parameter is a resistor element.

In FIG. 3, reference numeral 1 represents a current supply, 10 represents a mirror circuit that has first and second output terminals 10a and 10b, and is constituted by a transistor, 11 and 12 represent respectively independent first and second switching circuits, R represents a reference resistor element (reference parameter) to be included outside the ISI, Rv represents a variable resistor element (variable parameter) in which the resistance value can be switched within a range from 0Ω to the maximum value Rv Ω, 7 represents a voltage measuring circuit and S represents a CPU.

In the above-mentioned parameter correction circuit, the constant current supply 1 is connected to the mirror circuit 10, and one end of the reference resistor element R is directly connected to the first output terminal 10a of the mirror circuit 10 through the terminal 9, with the other end being connected to GND. Moreover, one end of the variable resistor element Rv is directly connected to the second output terminal 10b of the mirror circuit 10, with the other end being connected to GND.

Moreover, the voltage measuring circuit 7 is connected to the first output terminal 10a of the mirror circuit 10 through the first switching circuit I1, and the voltage measuring circuit 7 is also connected to the second output terminal 10b thereof through the second switching circuit 12. The voltage measured by the voltage measuring circuit 7 is A/D converted, and then outputted to the CPU 8. The CPU 8 carries out predetermined calculations based upon the voltage and the like measured by the above-mentioned voltage measuring circuit 7 so that the resistance value of the variable resistor element Rv is adjusted and set in a manner so as to correspond to the result of the calculations.

Next, with respect to the parameter correction circuit in accordance with the present embodiment, the following description will discuss the operations thereof First, the correcting operations of the resistance value of the variable resistor element Rv are explained. The first switching circuit 11 is turned on, while the second switching circuit 12 is turned off. In this state, the current value I1 of the constant current supply 1 is given to the reference resistor element R from the first output terminal 10*a* of the mirror circuit 10. At this time, a potential difference Vr=Rr*I1 of the reference resistor element R having a resistance value Rr is measured by the voltage measuring circuit 7. This potential difference Vr is outputted to the CPU 8, and stored therein. Since the resistance value Rr of the reference resistor element R has been preliminarily known, the current value Ii of the constant current supply 1 is found as I1=Vr/Rr. Based upon the current value I1, it is found that, in order to set the variable resistor element Rv to a resistance value corresponding to the target value R, the resistance value of the variable resistor element Rv is adjusted so that the measured voltage R*I1 in the voltage measuring circuit is represented by R*I1=R*Vr/Rr, when the current I1 is allowed to flow through the variable resistor element Rv from the mirror circuit 10.

Next, the first switching circuit 11 is turned off, and the second switching circuit 12 is turned on. In this case, the current value I1 of the constant current supply 1 is given to the variable resistor element Rv from the second output terminal 10*b* of the mirror circuit 10. Here, suppose that the resistance value of the variable resistor element Rv is set not to a target value R, but to a certain value R1, due to production deviations. At this time, the potential difference V1 (V1=R1*I1 ) of the variable resistor element Rv is measured by the voltage measuring circuit 7; thus, the resistance value of the variable resistor element Rv is adjusted and set so that the voltage value V1 is set to the voltage R*Vr/Rr that has been preliminarily calculated.

With respect to normal operations, the constant current supply 1 is turned off, the first switching circuit 11 is turned off, and the second switching circuit 12 is also turned off. The variable resistor element Rv is maintained at the setting obtained after the variable resistor element Rv has been adjusted so that the resistance value can be outputted as a resistance output, and utilized.

Therefore, in the present embodiment also, the reference resistor element R is included outside the LSI, and the current value I1 of a current flowing through the reference resistor element R is found with high precision so that it becomes possible to correct the resistance value of the variable resistor element Rv to the target value R without being influenced by production deviations in the constant current supply 1.

Moreover, in the first embodiment, since the current from the mirror circuit 2 is allowed to flow through the first switching circuit 3 or the second switching circuit 4 when the voltage Vr of the reference resistor element R and the voltage V1 of the variable resistor element Rv are measured, it is necessary to take the sizes of resistance components in the first and second switching circuits 3 and 4 into consideration upon designing; however, in the present embodiment, since the current is allowed to directly flow through the reference resistor element R and the variable resistor element Rv without the necessity of passing through the first and second switching circuits 11 and 12, it is not necessary to take the influences from the resistance components of these switching circuits 11 and 12 into consideration; thus, it becomes possible to correct the resistance value of the variable resistance element Rv to the target value R with higher precision.

Here, it is supposed that the upper limit value Rv of the resistance value of the variable resistor element Rv is preliminarily designed so as to satisfy Rv>R, R1. Moreover, in the present embodiment, the explanation has been given of a case in which the mirror circuit 10 is included on the power supply side with the reference resistor element R and the variable resistor element Rv being included on the GND side; however, another arrangement in which the mirror circuit 10 is included on the GND side with the reference resistor element R and the variable resistor element Rv being included on the power supply side or another arrangement in which the mirror circuit 10 and the reference resistor element R as well as the variable resistor element Rv are placed on opposite sides respectively with respect to the reference voltage, may of course be adopted, in the same manner as the above-mentioned first embodiment. Moreover, with respect to the internal structure of the mirror circuit 10, another structure other than the structure described above may be used.

Embodiment 5

Referring to the figures, the following description will discuss a fifth embodiment of the present invention.

Figure 4A:
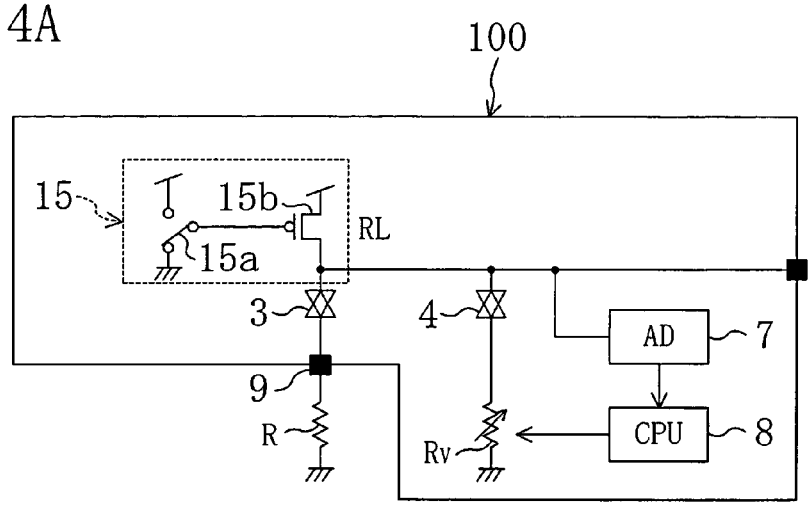
FIG. 4A shows the structure of the parameter correction circuit of the fifth embodiment of the present invention.

FIG. 4A shows a structure of a parameter correction circuit in accordance with the present embodiment. This embodiment also exemplifies a case in which a parameter is a resistor element.

In FIG. 4A, reference numeral 15 represents a load circuit that is constituted by a switching circuit 15*a* that switches between the power supply side and the ground side and a P-channel-type transistor 15*b*. This P-channel-type transistor 15*b* has its source connected to the power supply, and its gate receives the power supply potential or the ground potential selected by the above-mentioned switching circuit 15*a*.

Moreover, reference numerals 3 and 4 represent respectively independent switches, R represents a reference resistor element that is included outside the LSI through its terminal 9, Rv represents a variable resistor element in which the resistance value can be switched within a range from 0Ω to the maximum value Rv Ω, 7 represents a voltage measuring circuit and 8 represents a CPU.

In the parameter correction circuit in the present embodiment, in place of the mirror circuit 2 explained in FIGS. 2A to 2C and FIG. 3, the drain of the P-channel-type transistor 15*b* of the load circuit 15 is connected to one end of the reference resistor element R through the first switching circuit 3, with the other end of the reference resistor element R being connected to GND. Moreover, the drain of the P-channel-type transistor 15*b* of the load circuit 15 is also connected to the variable resistor element Rv through the second switching circuit 4, with the other end of the variable resistor element Rv being connected to GND. Moreover, the drain of the P-channel-type transistor 15*b* of the load circuit 15 is also connected to the voltage measuring circuit 7 so that the voltage measured by the voltage measuring circuit 7 is outputted to the CPU 8. The CPU 8 carries out predetermined calculations based upon the voltage measured as described above, and adjusts and sets the resistance value of the variable resistor element Rv in a manner so as to correspond to the result of the calculations.

Next, with respect to the parameter correction circuit of the present embodiment arranged as described above, the following description will discuss the operations thereof.

First, the correcting operations of the resistance value of the variable resistor element Rv are explained. The switching circuit 15a of the load circuit 15 is set on the GND side, and the first switching circuit 3 is turned on, while the second switching circuit 4 is turned off. In this state, the P-channel-type transistor 15b of the load circuit 15 is turned on so that the P-channel-type transistor 15b and the reference resistor element R are series-connected between the power supply (power supply voltage VDD) and GND); thus, by the resistance value (predetermined parameter value) RL of the P-channel-type transistor 15b of the load circuit 15 and the resistance value Rr of the reference resistor element R, a potential difference VL=Rr/(Rr+RL)*VDD is generated in the reference resistor element R, and this potential difference VL is measured by the voltage measuring circuit 7. The potential difference VIL is A/D converted, and outputted to the CPU 8 and stored therein.

Next, with the switching circuit 15a of the load circuit 15 being set on the GND side, the first switching circuit 3 is turned off, and the second switching circuit 4 is turned on. In this case, by the P-channel-type transistor 15b of the load circuit 15 and the variable resistor element Rv, a potential difference VL'=R1/(R1+RL)*VDD is generated in the variable resistor element Rv having an unknown resistance value R1, and this potential difference VL' is measured by the voltage measuring circuit 7. The resistance value of the variable resistor element Rv is adjusted and set so that this voltage value VL' is set to the potential difference VL that has been preliminarily stored in the CPU 8.

With respect to normal operations, the switching circuit 15a of the load circuit 15 is set on the power supply VDD side, the first switching circuit 3 is turned off, and the second switching circuit 4 is turned on. The resistance value of the variable resistor element Rv is maintained at the setting obtained after the adjustments so that the resistance value can be outputted as a resistance output, and utilized.

As described above, in accordance with the present embodiment, the reference resistor element R is placed outside the LSI, and its resistance value and the resistance value of the variable resistor element are compared with each other so that it becomes possible to correct the resistance value of the variable resistor element Rv to the target value R with higher precision without being influenced by production deviations in the load circuit 15. Here, it is supposed that the upper limit value Rv of the resistance value of the variable resistor element Rv is preliminarily designed so as to satisfy Rv>R, R1 and that the resistance value of each of the first and second switching circuits 3 and 4 is set to such a small value that influences thereof are ignorable.

Moreover, in the present embodiment, the explanation has been given of a case in which the load circuit 15 is included on the power supply side with the reference resistor element R and the variable resistor element Rv being placed on the GND side; however, another arrangement in which the load circuit 15 is included on the GND side with the reference resistor element R and the variable resistor element Rv being included on the power supply side may of course be adopted. In this case, the P-channel-type transistor 15b of the load circuit 15 is substituted by an N-channel-type transistor, of which source is grounded. Further, another arrangement in which the load circuit 15 and the reference resistor element R as well as the variable resistor element Rv are placed on opposite sides respectively with respect to the reference voltage, may be adopted. Moreover, with respect to the structure of the load circuit 15, another structure other than the structure described above may be used. Furthermore, the voltage measuring circuit 7 may have a structure using a comparator or the like.

Figure 4B:
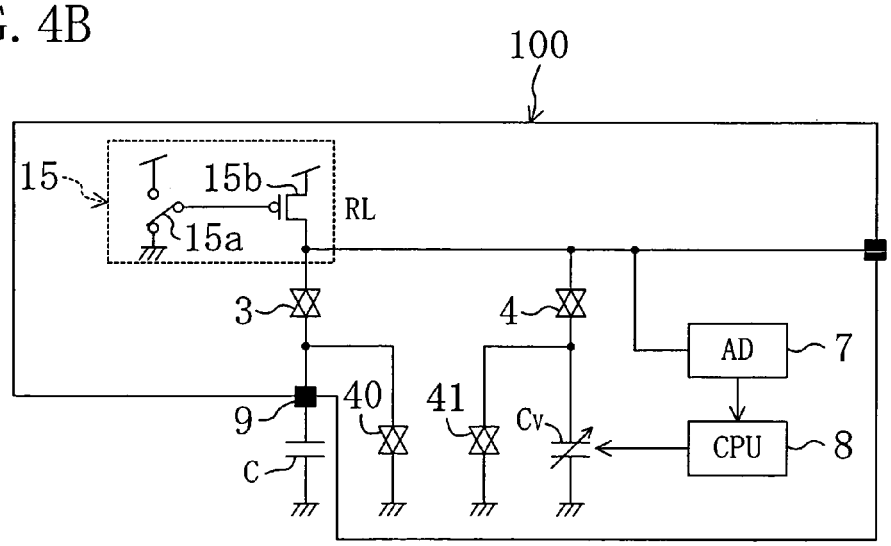
FIG. 4B shows a structure of a parameter correction circuit in which a variable resistor element serving as a parameter of FIG. 4A is substituted by a capacitor element.

FIG. 4B shows a modified example in which in the parameter correction circuit shown in FIG. 4A, the variable resistor element Rv serving as a parameter is changed to a variable capacitor Cv. The other structures are the same as those of FIG. 4A. The operations of the parameter correction circuit of FIG. 4B can be understood by reference to the operation explanations in FIG. 4A and the description of the third embodiment; therefore, the description thereof is omitted.

Embodiment 6

Referring to the figures, the following description will discuss a sixth embodiment of the present invention.

Figure 5:
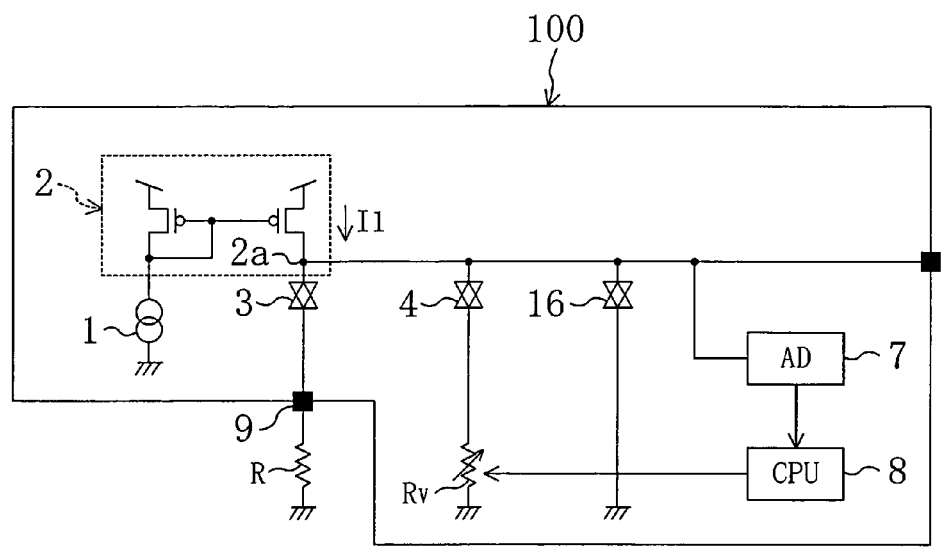
FIG. 5 shows a structure of a parameter correction circuit in accordance with a sixth embodiment of the present invention.

FIG. 5 shows a structure of a parameter correction circuit in accordance with the present embodiment. This embodiment also exemplifies a case in which a parameter is a resistor element.

The parameter correction circuit of FIG. 5 is different from the parameter correction circuit of FIG. 2A in that a third switching circuit 16 is further added thereto. The third switching circuit 16 has its one end connected to the output terminal 2a of the mirror circuit 2, with the other end being connected to GND, so that the current from the mirror circuit 2 is allowed to flow through the third switching circuit 16. The third switching circuit 16 has the same structure as the first and second switching circuit 3 and 4, and the respective resistance values RSW of the first, second and third switching circuits 3, 4 and 16 are mutually set to the same value.

With respect to the parameter correction circuit of the present embodiment having the above-mentioned arrangement, the following description will discuss the operations thereof.

First, correcting operations of the resistance value of the variable resistor element Rv will be explained. First, the switching circuit 3 is turned on, the second switching circuit 4 is turned off, and the third switching circuit 16 is turned off. In this state, the current I1 of the constant current supply 1 is supplied to the reference resistor element R from the mirror circuit 2 through the first switching circuit 3. At this time, a potential difference V1 is generated in the reference resistor element R, and this potential difference V1 is measured by the voltage measuring circuit 7. The potential difference V1 is represented by V1=(Rr+RSW)*I1 with the resistance value of the reference resistor element R being defined as Rr, and the measured value V1 is outputted to the CPU 8, and stored therein.

Next, the first switching circuit 3 is turned off, the second switching circuit 4 is also turned off, and the third switching circuit 16 is turned on. In this state, the current I1 of the constant current supply 1 is supplied to the third switching circuit 16 by the mirror circuit 2. At this time, a potential difference V2(V2=RSW*I1) is generated in the third switching circuit 16, and the potential difference V2 is measured by the voltage measuring circuit 7. Based upon the potential difference V1 preliminarily stored in the CPU 8 and this potential difference V2, the value I1 of a current flowing from the constant current supply 1 and the resistance value RSW of the first, second and third switching circuits 3, 4 and 16 are found from I1=(V1−V2)/Rr and RSW=Rr/(V1/V2−1).

Next, the first switching circuit 3 is turned off, the second switching circuit 4 is turned on, and the third switching circuit 16 is turned off. In this case, the same current value I1 of the constant current supply 1 is supplied to the variable resistor element Rv having an unknown resistance value R1 by the mirror circuit 2 through the second switching circuit 4. At this time, a potential difference V3 that is generated in the variable resistor element Rv is represented by V3=(R1+RSW)*I1, and this potential difference V3 is measured by the voltage measuring circuit 7. This potential difference V3 is represented by V3=(V1−V2)*R1/Rr+V2 by using the current value I1 of the constant current supply 1 found as described above and the resistance value RSW of the second switching circuit 4. Therefore, in the case where the resistance value R1 of the variable resistor element Rv is set to the target value R, the potential difference V3 is found, and while carrying out voltage-measuring processes by the voltage measuring circuit 7, the resistance value of the variable resistor element Rv is adjusted and set so that the potential difference generated in the variable resistor element Rv is allowed to correspond to the potential difference V3.

During normal operations, the constant current supply 1 is turned off, the first switching circuit 3 is turned off, the second switching circuit 4 is turned on, and the third switching circuit 16 is turned off. Here, the variable resistor element Rv is maintained at the setting obtained after the adjustments so that the resistance value is outputted as a resistance output, and utilized.

As described above, in accordance with the present embodiment, the resistance value of the variable resistor element Rv can be corrected to the target value R with high precision, by taking influences from the resistance values of the first and second switching circuits 3 and 4 into consideration.

Here, in the present embodiment also, another structure in which the positions of the mirror circuit 2 and the first to third switching circuits 3, 4 and 16 are changed onto the GND side may be adopted, or the inner structure of the mirror circuit 2 may of course be changed, as described above.

Embodiment 7

Referring to the figures, the following description will discuss a seventh embodiment of the present invention.

Figure 6:
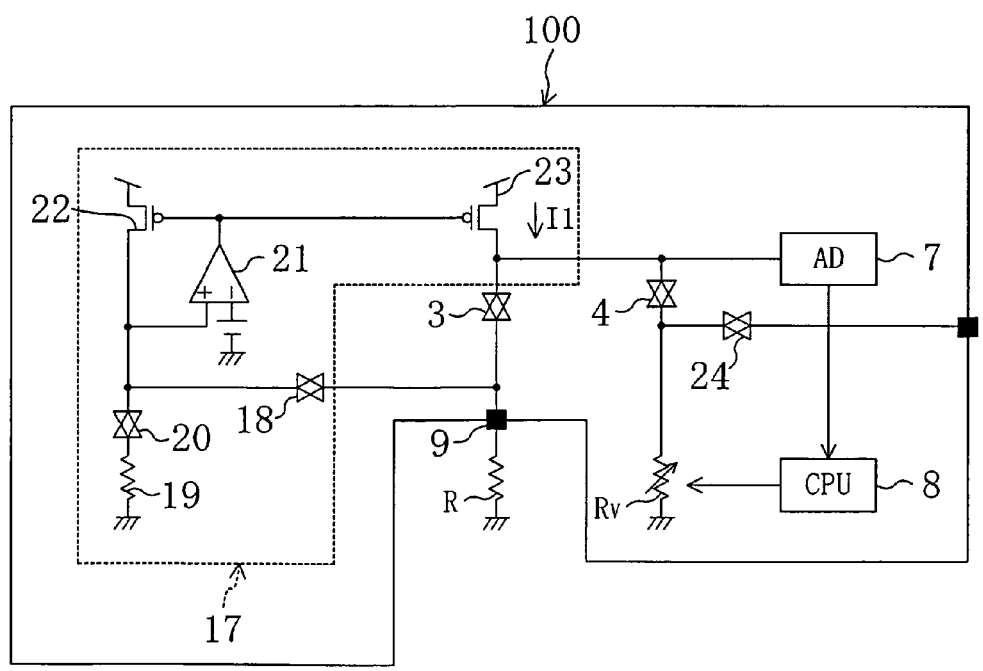
FIG. 6 shows a structure of a parameter correction circuit in accordance with a seventh embodiment of the present invention.

FIG. 6 shows a structure of a parameter correction circuit in accordance with the present embodiment. This embodiment also exemplifies a case in which a parameter is a resistor element.

In FIG. 6, reference numerals 3 and 4 represent respectively independent first and second switches, R represents a reference resistor element that has a preliminarily known resistance value and is included through an external terminal 9 of the LSI 100, Rv represents a variable resistor element in which the resistance value can be switched within a range from 0Ω to the maximum value Rv Ω, 7 represents a voltage measuring circuit, 8 represents a CPU, 17 represents a current output circuit, and 24 represents a switching circuit. In the above-mentioned current output circuit 17, reference numeral 18 is a switching circuit, 19 is a resistor element, 20 is a switching circuit, 21 is an amplifier, and 22 and 23 are P-channel-type transistors, respectively.

In the above-mentioned current output circuit 17, one end of the resistor element 19 is connected to GND, and the other end is connected to the drain of the P-channel-type transistor 22 and the non-inversion input terminal of the amplifier 21 through the switching circuit 20, and is also connected to one end of the reference resistor element R through the switching circuit 20, the switching circuit 18 and the external terminal 9. The source of the P-channel-type transistor 22 is connected to the power supply, and to its gate are connected the output of the amplifier 21 and the gate of another P-channel-type transistor 23. The source of the P-channel-type transistor 23 is connected to the power supply, and its drain forms a current output terminal. Moreover, a reference voltage is supplied to the inversion input terminal of the amplifier 21.

With the above-mentioned arrangement, upon normal operations, the current output circuit 17 turns the built-in switching circuit 18 on, with the switching circuit 20 being turned off, so that the reference resistor element R is connected to the non-inversion input terminal of the amplifier 21; thus, a current having a value with high precision is outputted from the P-channel-type transistor 23.

Further, in the present embodiment, the reference resistor element R to be used in the above-mentioned current output circuit 17 is also utilized as a reference resistor element that is used for correcting the resistance value of the variable resistor element Rv. In other words, the current output terminal (drain of the P-channel-type transistor 23) of the current output circuit 17 is connected to one end of the reference resistor element R through the first switching circuit 3, and is also connected to one end of the variable resistor element Rv through the second switching circuit 4. One end of this variable resistor element Rv is also connected to the third switching circuit 24.

In the same manner as described above, the voltage measuring circuit 7 is connected to the current output terminal of the current output circuit 17 so that its measured voltage is inputted to the CPU 8. As described earlier, the CPU 8 carries out predetermined calculations, and adjusts and sets the resistance value of the variable resistor element Rv so as to correspond to the result of the calculations. The other end of the variable resistor element Rv and the other end of the reference resistor element R are commonly connected to GND.

Next, with respect to the parameter correction circuit in accordance with the present embodiment, the following description will discuss the operations thereof First, the correcting operations of the resistance value of the variable resistor element Rv are explained. The first switching circuit 3 is turned on, the second switching circuit 4 is turned off, the third switching circuit 24 is turned off, the switching circuit 20 inside the current output circuit 17 is turned on, and the switching circuit 18 is turned off. In this state, in the current output circuit 17, a reference current I1 is allowed to flow from the P-channel-type transistor 23 by a reference voltage applied to the inversion input terminal of the amplifier 21 and the resistor element 19, and this current I1 flows to the reference resistor element R through the first switching circuit 3. At this time, a potential difference Vr generated in the reference resistor element R is measured by the voltage measuring circuit 7.

Next, in the above-mentioned state, the first switching circuit 3 is turned off from the on-state, and the second switching circuit 4 is turned on from the off-state. In this state, the reference current I1, which flows through the P-channel-type transistor 23 of the current output circuit 17, is given to the variable resistor element Rv through the second switching circuit 4. At this time, a potential difference V1 of the variable resistor element Rv is measured by the voltage measuring circuit 7. The method for correcting the resistance value of the variable resistor element Rv by utilizing the results of these voltage measurements is the same as the correcting method described in the above-mentioned first embodiment.

During normal operations, the first switching circuit 3 is turned off, the second switching circuit 4 is also turned off, the third switching circuit 24 is turned on, the switching circuit 20 in the current output circuit 17 is turned off and the switching circuit 18 is turned on. In this state, the resistance value of the variable resistor element Rv is maintained at the setting obtained after the adjustments so that it is outputted through the third switching circuit 24 as a resistance output, and utilized.

As described above, in accordance with the present embodiment, during normal operations, the reference resistor element R outputs a current having a value with high precision in cooperation with the current output circuit 17, and upon adjusting the resistance value of the variable resistor element Rv, the existing reference resistor element (a parameter that has a preliminarily known parameter value, and is originally connected) R is utilized so that it is not necessary to newly include a reference resistor element and a terminal 9 used for connecting this, so as to adjust the resistance value of the variable resistor element Rv.

Moreover, in the present embodiment, the explanation has been given of a case in which the current output circuit 17 is included on the power supply side, with the reference resistor element R and the variable resistor element Rv being placed on the GND side; however, another arrangement in which the current output circuit 17 is included on the GND side with the reference resistor element R and the variable resistor element Rv being included on the power supply side or another arrangement in which the current output circuit 17 and the reference resistor element R as well as the variable resistor element Rv are placed on opposite sides respectively with respect to the reference voltage, may of course be adopted. Moreover, with respect to the internal structure of the current output circuit 17, another structure other than the structure described above may be used.

Furthermore, in the present embodiment, the reference resistor element R to be used in the current output circuit 17 is utilized and sharedly used for adjusting the resistance value of the variable resistor element Rv; however, in the case where the reference resistor element has already been used in a circuit other than the current output circuit 17, the corresponding reference resistor element can be utilized and sharedly used with the same effects.

Embodiment 8

Referring to the figures, the following description will discuss an eighth embodiment of the present invention.

Figure 7A:
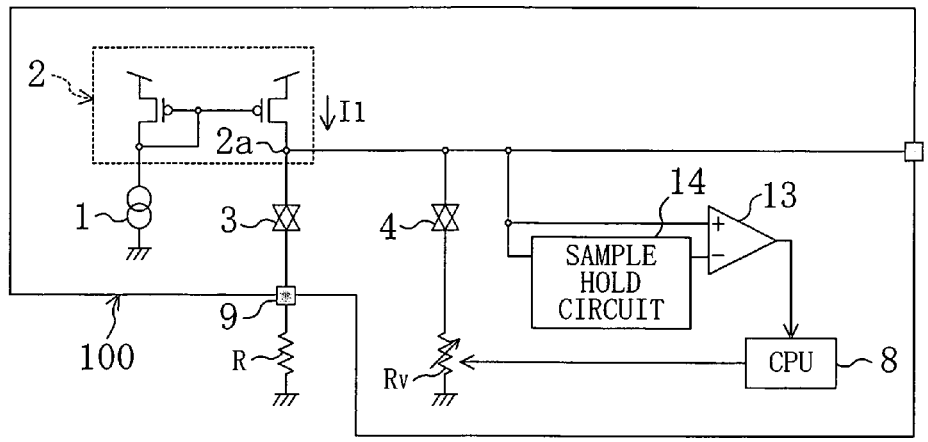
FIG. 7A shows a structure of a parameter correction circuit in accordance with a eighth embodiment of the present invention.

FIG. 7A shows a structure of a parameter correction circuit in accordance with the present embodiment. This embodiment also exemplifies a case in which a parameter is a resistor element.

As shown in FIG. 7A, the arrangement of the present embodiment is different from the first embodiment shown in FIG. 2A in that a comparator 13 and a sample hold circuit 14 are included in place of the voltage measuring circuit 7 of FIG. 2A.

The above-mentioned comparator 13 has its non-inversion input terminal connected to the output terminal 2a of the mirror circuit 2. Moreover, the input side of the sample hold circuit 14 is connected to the output terminal 2a of the mirror circuit 2. The output side of the sample hold circuit 14 is connected to the inversion input terminal of the comparator 13. The output of the comparator 13 is inputted to the CPU 8.

Next, with respect to the parameter correction circuit in accordance with the present embodiment, the following description will discuss the operations thereof. First, the correcting operations of the resistance value of the variable resistor element Rv are explained. The first switching circuit 3 is turned on, and the second switching circuit 4 is turned off. In this state, a current I1 of the constant current supply 1 is supplied to the reference resistor element R through the first switching circuit 3 by the mirror circuit 2. At this time, a potential difference $Vr=Rr*I1$ generated in the reference resistor element R having a resistance value Rr is held by the sample hold circuit 14, and is then inputted to the inversion input terminal of the comparator 13.

Next, the first switching circuit 3 is turned off, and the second switching circuit 4 is turned on. At this time, the same current I1 of the constant current supply 1 is given to the variable resistor element Rv through the second switching circuit 4 by the mirror circuit 2. Here, the resistance value of the variable resistor element Rv is not set to a target value R (in this case, resistance value Rr of the reference resistor element R), but offset to a certain value R1 due to production deviations; however, the resistance value R1 of the variable resistor element Rv is set as the minimum value. Moreover, the sample hold circuit 14 is maintained at the preceding voltage. Here, in the case where the resistance value R1 of the variable resistor element Rv is represented by R1<Rr in association with the resistance value Rr of the reference resistor element R, the output of the comparator 13 is in a Low level; however, the resistance value R1 of the variable resistor element Rv is then adjusted in an increasing manner so that a state of R1>Rr, that is, an adjusted value obtained immediately after the output state of the comparator 13 has been changed to a High level, is maintained. This state corresponds to a state in which the resistance value R1 of the variable resistor element Rv has been adjusted to the resistance value Rr of the reference resistor element R, and the corresponding adjusted value is stored in the CPU 8.

During normal operations, the constant current supply 1 is turned off, the first switching circuit 3 is also turned off, and the second switching circuit 4 is turned on. Thus, the variable resistor element Rv is maintained at the set value Rr obtained after the adjustments so that it is outputted as a resistance output, and utilized.

As described above, the present embodiment uses not the voltage measuring circuit 7 as shown in FIG. 2A, but the comparator 13 and the sample hold circuit 14, so that the resistance value of the variable resistor element Rv is corrected to a target value with high precision, while taking influences from production deviations in the constant current supply 1 into consideration.

Here, it is supposed that the upper limit value Rv of the resistance value of the variable resistor element Rv is preliminarily designed to satisfy Rv>R, R1. Moreover, it is also supposed that the resistance value of each of the first and second switching circuits 3 and 4 is designed to such a small value that influences thereof are ignorable.

Moreover, in the present embodiment, the explanation has been given of a case in which the mirror circuit 2 is included on the power supply side, with the reference resistor element R and the variable resistor element Rv being placed on the GND side; however, another arrangement in which the mirror circuit 2 is included on the GND side with the reference resistor element R and the variable resistor element Rv being included on the power supply side or another arrangement in which the mirror circuit 2 and the reference resistor element R as well as the variable resistor element Rv are placed on opposite sides respectively with respect to the reference voltage, may of course be adopted. Furthermore, with respect to the internal structure of the mirror circuit 2, another structure other than the structure described above may be used, or the polarity of the connection to the input of the comparator 13 may be set to an opposite polarity. In addition, with respect to the adjusting method for the resistance value of the variable resistor element Rv, the adjustments may of course be carried out so that the resistance value is changed from a greater value to a smaller value.

Figure 7B:
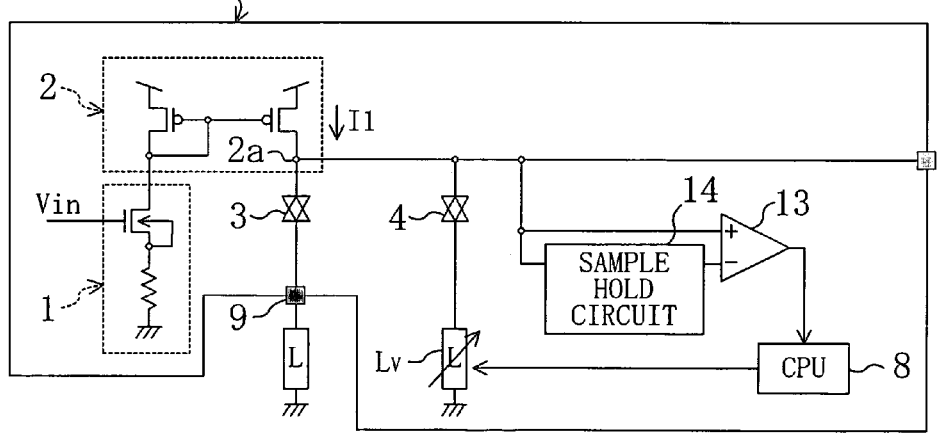
FIG. 7B shows a structure of a parameter correction circuit in which a variable resistor element serving as a parameter of FIG. 7A is substituted by an inductor element.

FIG. 7B shows a modified example in which, in place of the variable resistor element Rv used as a parameter shown in FIG. 7A, an inductor element Lv is adopted. The entire structure and the operations of FIG. 7B can be understood by reference to the explanations of the variable resistor element Rv in FIG. 7A and the second embodiment as shown in FIG. 2B; therefore, the description thereof is omitted.

Figure 7C:
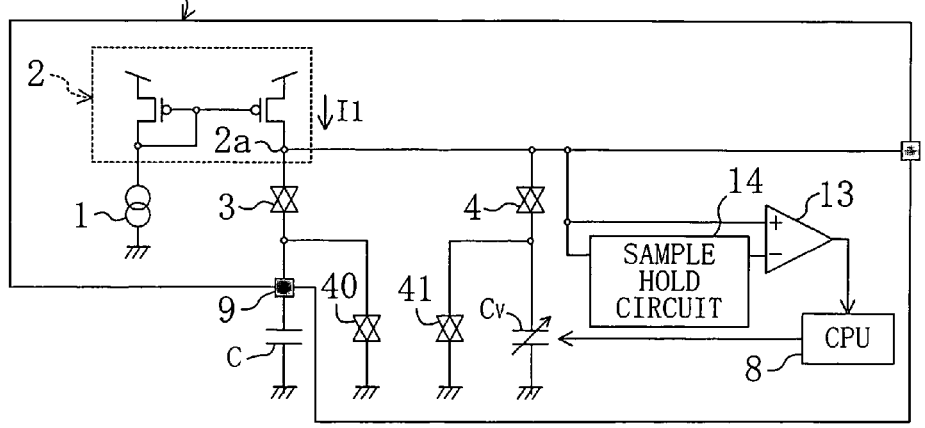
FIG. 7C shows a structure of a parameter correction circuit in which a variable resistor element serving as a parameter of FIG. 7A is substituted by a capacitor element.

FIG. 7C shows a modified example in which a capacitor Cv is used as a parameter. The entire structure and the operations of FIG. 7C can be understood by reference to the explanations of the variable resistor element Rv in FIG. 7A and the third embodiment as shown in FIG. 2C; therefore, the description thereof is omitted.

Embodiment 9

The following description will discuss a ninth embodiment of the present invention.

The present embodiment shows applied examples of the parameter correction circuit described in each of the first to eight embodiments.

In the present embodiment, after the resistance value of the variable resistor element Rv serving as the variable parameter described in each of the above-mentioned first to eighth embodiments has been corrected to a target value, the variable resistor element Rv is combined with a capacitor to form a filter circuit. Then, this filter circuit using the variable resistor element Rv is allowed to form a filter portion that is one part of a PLL circuit.

In the case where the PLL circuit is included in an LSI 100, problems are raised in the characteristics of the PLL circuit due to production deviations; however, the filter circuit, which uses the variable resistor element Rv that has been corrected, is allowed to form the filter portion of the PLL circuit so that characteristics of the loop gain and the like of the PLL circuit can be maintained stably. Moreover, it is possible to cut the number of the filter-use terminals in the PLL circuit.

Embodiment 10

The following description will discuss a tenth embodiment of the present invention.

The present embodiment shows another applied example of the parameter correction circuit described in each of the first to eight embodiments, and the parameter correction circuit thereof is used as a current-voltage converter.

The following description exemplifies a case in which the parameter correction circuit of FIG. 2A explained in the first embodiment is used. First, the resistance value of the variable resistor element Rv is corrected by using the correction method described in the first embodiment. Then, during normal operations, the constant current supply 1 is turned on, the first switching circuit 3 is turned off, and the second switching circuit 4 is turned on. In this state, the current value I1 of the constant current supply 1 is changed so that the same current value I1 is also applied to the variable resistor element Rv through the mirror circuit 2, with the result that a voltage that has been subjected to a current-voltage conversion is obtained from the resistance output. It is noted that another constant current supply (not shown), instead of the constant current supply 1, may flow the current to the variable resistor element Rv.

In this case, since the resistance value of the variable resistor element Rv is corrected to the target value R, it is possible to obtain a current-voltage converting characteristic with high precision.

Embodiment 11

The following description will discuss an eleventh embodiment of the present invention.

The present embodiment shows still another applied example of the parameter correction circuit described in each of the first to eight embodiments.

In other words, in the present embodiment, for example, in the case where, upon forming a semiconductor circuit (LSI) including a parameter correction circuit explained in the first embodiment, one or a plurality of variable resistor elements having the same structure as the variable resistor element Rv of the above-mentioned parameter correction circuit are contained on this semiconductor circuit, these variable resistor elements are also allowed to exert the same correction results as the variable resistor element Rv of the above-mentioned parameter correction circuit.

Therefore, in the present embodiment, by adjusting the resistance value of the variable resistor element Rv of the parameter correction circuit, the correction results are also reflected to the resistance value of the other variable resistor elements having the same structure so that the resistance value of the other variable resistor elements can be set to the target value.

Wherein, the variable parameter is the variable resistor element Rv in the present embodiment, but the variable parameter may be to a variable capacitor element or variable inductor element, as well.

Embodiment 12

The following description will discuss a twelfth embodiment of the present invention.

The present embodiment shows a specific example of a case in which, when the variable parameter of the parameter correction circuit is prepared as a variable inductor element, this variable inductor element is used as a variable inductor element to be included in an oscillator circuit.

Figure 8:
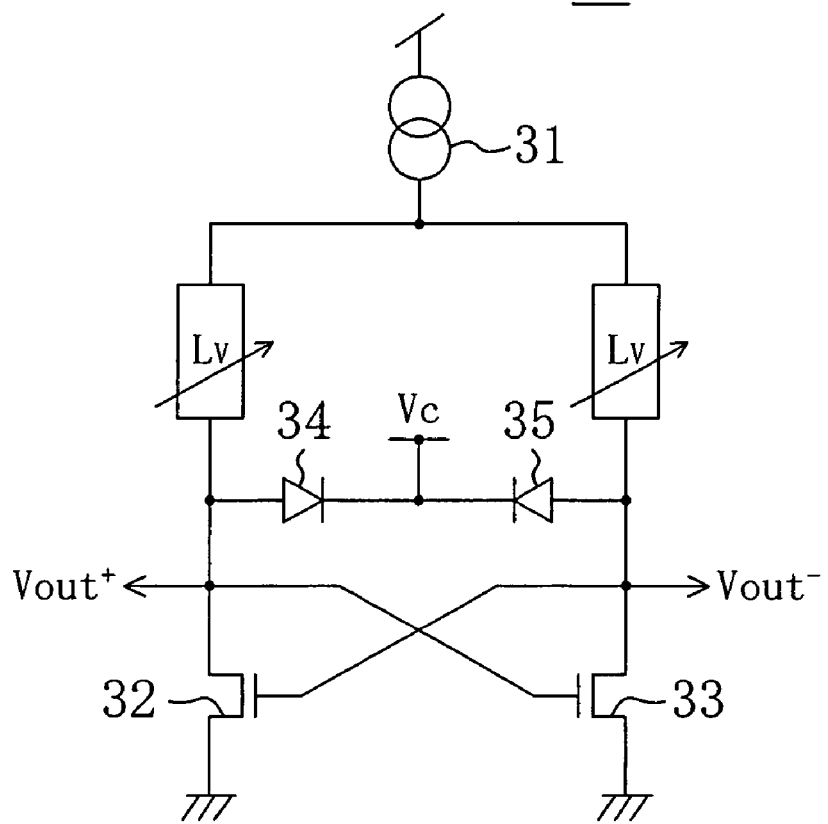
FIG. 8 shows a structure of an oscillator circuit in accordance with a twelfth embodiment of the present invention.

FIG. 8 shows an oscillator circuit 30 of the present embodiment. This oscillator circuit 30 is provided with a current supply 31, two variable inductor elements Lv and Lv, two N-type transistors 32 and 33, and two variable capacitive diodes 34 and 35. This oscillator circuit 30 forms a differential-type negative Gm oscillator circuit. A control voltage Vc is applied to the two variable capacitive diodes 34 and 35, and the oscillating frequency is controlled by variably adjusting a junction capacitance in these two variable capacitive diodes 34 and 35. A resonance circuit in this oscillator circuit 30 is a differential LC resonance circuit that is operated based upon the two variable inductor elements Lv and Lv and the junction capacitance in the two variable capacitive diodes 34 and 35. With respect to the above-mentioned two N-type transistors 32 and 33, the gates and drains thereof are mutually connected in a manner so as to diagonally intersect with each other to form a positive feedback circuit so that oscillation outputs Vout+ and Vout− are obtained through this positive feedback circuit.

In the above-mentioned oscillator circuit 30, in the same manner as the second embodiment shown in the aforementioned FIG. 2B, one of the variable inductor elements Lv serves as a variable inductor element Lv to be included in a parameter correction circuit so as to correct its inductance value to a target value Lo, and the other inductor element Lv is allowed to exert the same correction result as the above-mentioned variable inductor element Lv, as shown in the above-mentioned eleventh embodiment. Thereafter, for example, in the case where the junction capacitance of the two variable capacitive diodes 34 and 35 is adjusted to a capacitance Co, the oscillating frequency f of the outputs Vout+ and Vout− of this oscillator circuit is represented by the following equation on the assumption that no parasitic capacitance exists:

$$f \propto 1/\sqrt{(Lo*Co)}$$

In this case, inductance values of the two variable inductor elements Lv and Lv are corrected to the target value Lo with high precision by using the parameter correction circuit of the present invention so that the oscillating frequency f of the oscillator circuit 30 can be adjusted to a desired frequency with high precision and the oscillator circuit 30 of this type can be included in the LSI.

The oscillator circuit 30 shown in FIG. 8 is used as an oscillator circuit using the variable inductor element in the present invention, but the present invention is, of course, applicable to an oscillator circuit having another structure.

Embodiment 13

The following description will discuss a thirteenth embodiment of the present invention.

The present embodiment shows a specific structure of a variable parameter in the parameter correction circuit described in each of the first to eight embodiments.

Figure 9A:
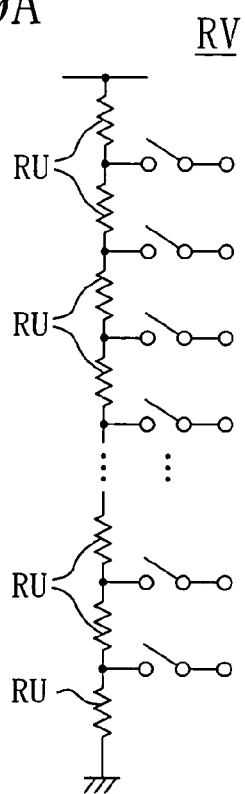
FIG. 9A shows an internal structure of a variable resistor element in accordance with a thirteenth embodiment.

In other words, in the present embodiment, as shown in FIG. 9A, the variable resistor element Rv of the parameter correction circuit as described above has a structure in which a plurality (n-number) of unit resistor elements RU are connected in series with one another.

Supposing that the resistance value R of a variable resistor element Rv after the correcting processes is constituted by a 2*N-number of unit resistor elements RU, the resistance value R is indicated by R=(2*N) *RU. For example, in an attempt to obtain a half value of the resistance value R as a target value, the variable resistor element Rv is adjusted and set so as to be constituted by N-number of unit resistor elements RU; thus, it becomes possible to easily achieve R/2=N*RU. In other words, by allowing the CPU 8 to calculate the set resistance value after the correcting process of the variable resistor element Rv, it becomes possible to obtain a desired corrected resistance value in the variable resistor element Rv.

Therefore, in the parameter correction circuit, the present embodiment makes it possible to provide a variable resistor element (variable parameter) Rv that can be scaled to a desired resistance value (parameter value).

Figure 9B:
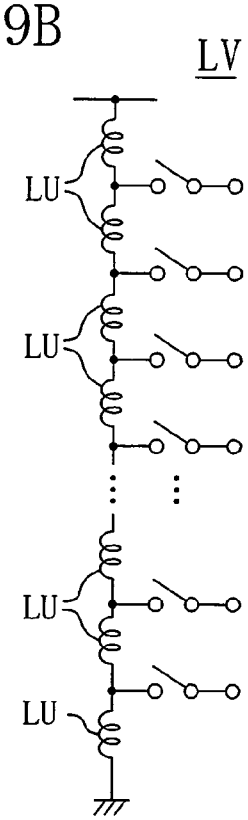
FIG. 9B shows an internal structure of a variable inductor element in accordance with the same embodiment and FIG. 9C shows an internal structure of a variable capacitor element in accordance with the same embodiment.
Figure 9C:
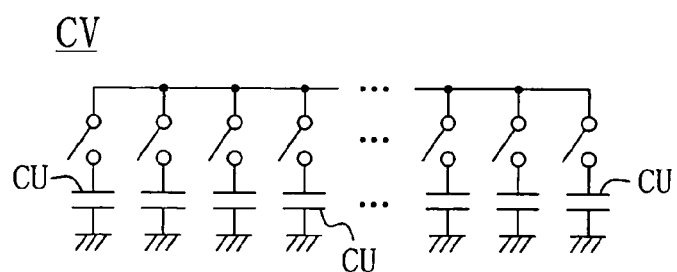
Figure 10:
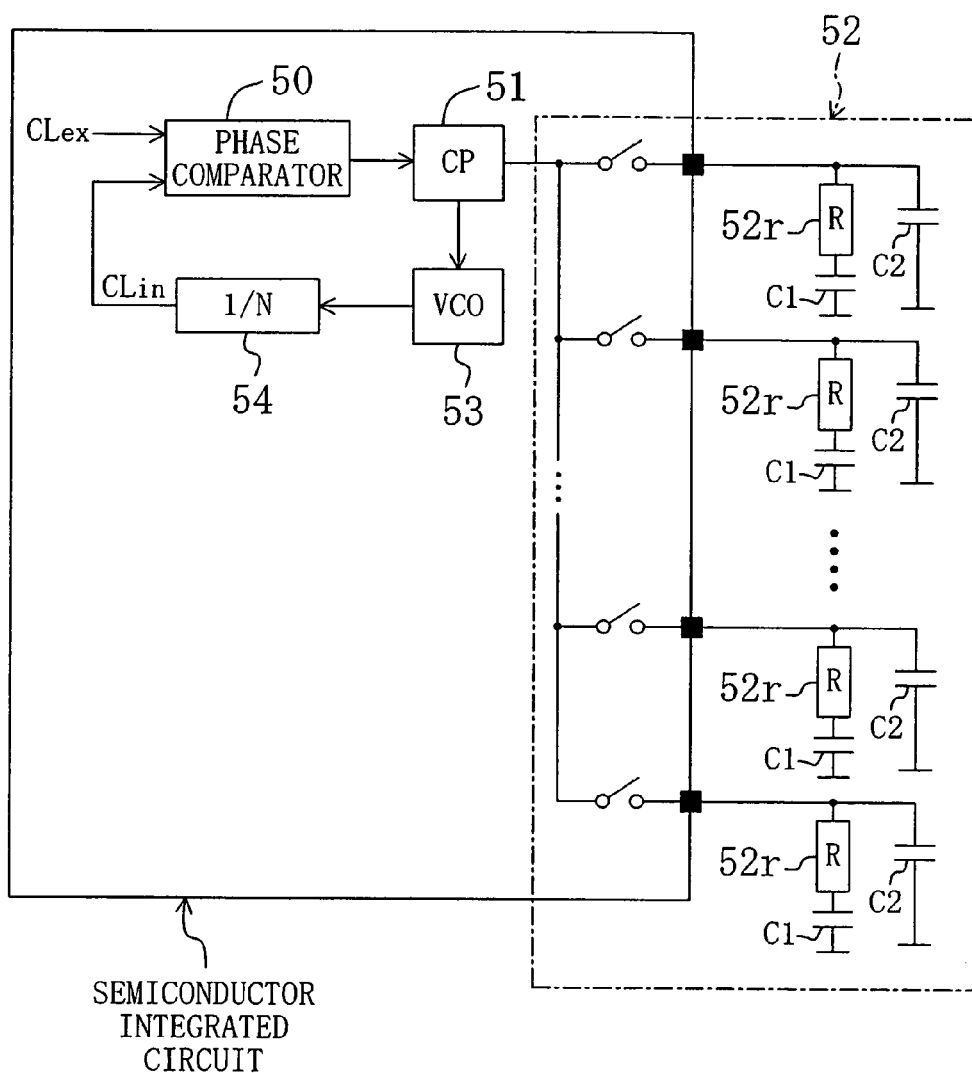
FIG. 10 shows a schematic entire structure of a conventional semiconductor integrated circuit having a built-in PLL circuit.
Figure 11:
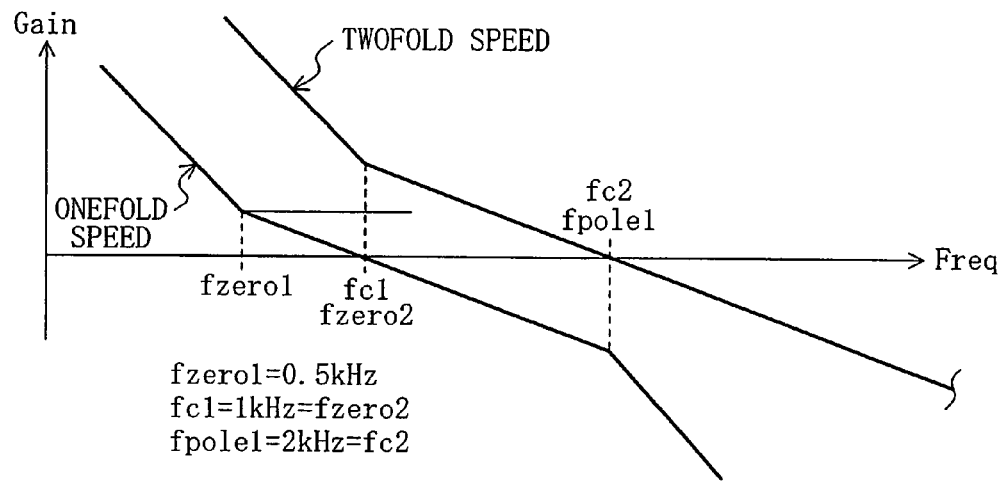
FIG. 11 shows a loop characteristic of the PLL circuit in the conventional semiconductor integrated circuit.
Figure 12:
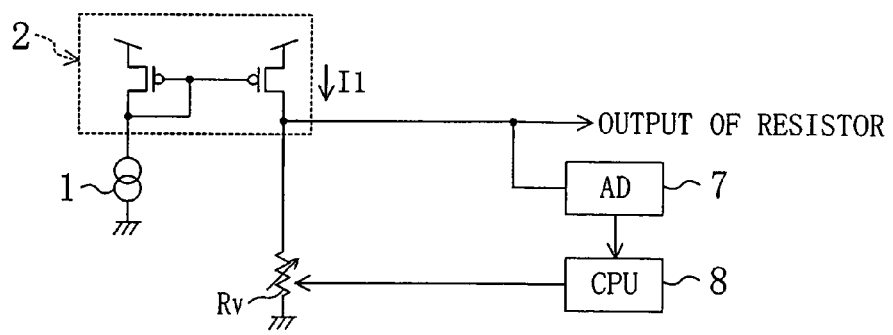
FIG. 12 shows a structure of a conventional parameter correction circuit.

FIG. 9B shows a structure in which, in place of the n-number of unit resistor elements RU shown in FIG. 9A, n-number of unit inductance elements LU are series-connected to form a variable inductor element Lv. FIG. 9C shows a structure in which n-number of unit capacitor elements CU are parallel-connected to form a variable capacitor Cv. It is possible to provide a variable inductor element Lv and a variable capacitor element Cv (variable parameter) that can be scaled to a desired inductance value and a capacitance value (parameter value).

What is claimed is:

1. A parameter correction circuit, which is a built-in parameter correction circuit of a semiconductor integrated circuit, comprising:
    a current supply circuit;
    a variable parameter component;
    a plurality of switching circuits;
    a voltage measuring circuit; and
    an adjusting circuit that adjusts a parameter value of the variable parameter component, wherein
    the current supply circuit, the variable parameter component, the plurality of switching circuits, the voltage measuring circuit and the adjusting circuit are included in the semiconductor integrated circuit,
    any one of the switching circuits is connected to a reference parameter component having a preliminarily known parameter value,
    the switching circuits are allowed to switch electrical connections among the current supply circuit, the reference parameter component, the variable parameter component and the voltage measuring circuit,
    the voltage measuring circuit measures voltages generated in the reference parameter component and the variable parameter component respectively when current is respectively supplied to the reference parameter component and the variable parameter component from the current supply circuit, and
    the adjusting circuit adjusts the parameter value of the variable parameter component such that the voltage of the variable parameter component reaches the voltage of the reference parameter component.

2. A parameter correction circuit according to claim 1, wherein the variable parameter component and the reference parameter component are a variable resistor element and a reference resistor element, respectively.

3. A parameter correction circuit according to claim 2, wherein the parameter correction circuit is used as a current-voltage converter which, after the resistance value of the variable resistor element has been corrected to a target value, outputs a voltage that is generated in the variable resistor element, upon allowing a current to flow from a current supply or another current supply to the variable resistor element.

4. A parameter correction circuit according to claim 1, wherein the variable parameter component and the reference parameter component are a variable inductor element and a reference inductor element, respectively.

5. A parameter correction circuit according to claim 4, wherein the parameter correction circuit is used as an oscillator circuit in which, after the inductance value of the variable inductor element has been corrected to a target value, an oscillating frequency thereof is set to a target frequency.

6. A parameter correction circuit according to claim 1, wherein the variable parameter component and the reference parameter component are a variable capacitor element and a reference capacitor element, respectively.

7. A parameter correction circuit according to claim 1, wherein the reference parameter component is placed outside the semiconductor integrated circuit, and connected to an external terminal of the semiconductor integrated circuit.

8. A parameter correction circuit according to claim 7, wherein the reference parameter component is shared by a parameter component having a preliminarily known parameter value, which is originally connected to the external terminal of the semiconductor integrated circuit.

9. A parameter correction circuit according to claim 1, wherein the reference parameter component is included in the semiconductor integrated circuit.

10. A parameter correction circuit according to claim 1, wherein the semiconductor integrated circuit having the built-in parameter correction circuit is a PLL circuit, the PLL circuit having a phase comparator, a charge pump, a filter circuit, a voltage control oscillator and a frequency divider, the filter circuit being constituted by a resistor element and a capacitor element, the variable parameter component being included in the semiconductor integrated circuit as the resistor element or the capacitor element.

11. A parameter correction circuit according to claim 1, wherein the current supply circuit comprises a current supply, and a mirror circuit having an output terminal, the mirror circuit being connected to the current supply and allows a current corresponding to the current of the current supply to flow from the output terminal.

12. A parameter correction circuit according to claim 11, wherein the switching circuits comprise first and second switching circuits, the first switching circuit is placed between the mirror circuit and the reference parameter component, and the second switching circuit is placed between the mirror circuit and the variable parameter component.

13. A parameter correction circuit according to claim 12, wherein the switching circuits further comprise a third switching circuit having the same structure as the first and second switching circuits have, and the third switching circuit is connected to the output terminal of the mirror circuit so that the voltage measuring circuit measures a voltage of the third switching circuit when a current is allowed to flow from the mirror circuit to the third switching circuit to obtain a parameter value of the first and second switching circuits for the parameter value adjustment of the variable parameter component.

14. A parameter correction circuit according to claim 1, wherein the current supply circuit comprises a current supply and a mirror circuit having first and second terminals, the mirror circuit being connected to the current supply and allows a current having the same value as the current of the current supply to flow from the first terminal to the reference parameter component, and also to flow from the second terminal to the variable parameter component.

15. A parameter correction circuit according to claim 14, wherein the switching circuits comprise first and second switching circuits, the first switching circuit is placed between the reference parameter component and the voltage measuring circuit, and the second switching circuit is placed between the variable parameter component and the voltage measuring circuit.

16. A parameter correction circuit according to claim 1, wherein the current supply circuit comprises a load circuit, the load circuit has a transistor that has a source connected to a current supply or grounded, and supplies a current through a drain thereof, and a switching circuit that is connected to the gate of the transistor so as to on-off control the transistor.

17. A parameter correction circuit according to claim 1, wherein the voltage measuring circuit comprises a sample hold circuit that holds the voltage of the reference parameter component, and a comparator that compares the voltage of the variable parameter component with the voltage of the reference parameter component that has been held in the sample hold circuit.

18. A parameter correction circuit according to claim 1, wherein the semiconductor integrated circuit comprises another variable parameter component having the same structure as the variable parameter component, and the another variable parameter component is adjusted to the same parameter-value as the variable parameter component that is included in the parameter correction circuit.

19. A parameter correction circuit according to claim 1, wherein the variable parameter component comprises a plurality of unit parameter components that are series-connected to one another, and among all the unit parameter components, a desired number of the unit parameter components are extracted.

20. A parameter correction circuit according to claim 1, wherein the variable parameter component comprises a plurality of unit parameter components that are parallel-connected to one another, and among all the unit parameter components, a desired number of the unit parameter components are extracted.

21. A parameter correction method for correcting a parameter value of a variable parameter component, the method comprising the steps of:

connecting a current supply circuit to a reference parameter component having a preliminarily known parameter value;

allowing a current to flow from the current supply circuit through the reference parameter component to measure a voltage of the reference parameter component at this time;

calculating a value of the current supplied from the current supply circuit based upon the voltage of the reference parameter component and the preliminarily known parameter value of the reference parameter component;

calculating a target voltage of the variable parameter component when the parameter value of the variable parameter component is set to a target value based upon the value of the current calculated; and while allowing a current to flow from the current supply circuit to the variable parameter component and measuring a voltage of the variable parameter component at this time, correcting the parameter value of the variable parameter component so that the voltage of the variable parameter component is set to the target voltage.

* * * * *